US005546561A

United States Patent [19]

Kynett et al.

[11] Patent Number: 5,546,561

[45] Date of Patent: Aug. 13, 1996

[54] CIRCUITRY AND METHOD FOR SELECTIVELY PROTECTING THE INTEGRITY OF DATA STORED WITHIN A RANGE OF ADDRESSES WITHIN A NON-VOLATILE SEMICONDUCTOR MEMORY

[75] Inventors: Virgil N. Kynett, El Dorado Hills; Mickey L. Fandrich, Placerville, both of Calif.

[73] Assignee: Intel Corporation, Santa Clara, Calif.

[21] Appl. No.: 372,891

[22] Filed: Jan. 13, 1995

Related U.S. Application Data

[63] Continuation of Ser. No. 197,364, Feb. 15, 1994, abandoned, which is a continuation of Ser. No. 698,721, May 10, 1991, abandoned, which is a continuation-in-part of Ser. No. 654,375, Feb. 11, 1991, abandoned.

[51] Int. Cl.[6] .............................. G06F 12/14; G11C 7/00

[52] U.S. Cl. .......................... 395/490; 365/195; 365/218

[58] Field of Search .................................... 395/400, 425, 395/490, 411, 186; 365/195, 218; 380/3, 4; 364/DIG. 1, 200 MS File, 900 MS File

[56] References Cited

U.S. PATENT DOCUMENTS

| | | | |
|---|---|---|---|
| 3,573,855 | 4/1971 | Cragon et al. | 395/425 |
| 3,742,458 | 6/1973 | Inoue et al. | 395/425 |
| 3,803,559 | 4/1974 | Bandoo et al. | 364/900 |
| 3,845,425 | 10/1974 | Clements et al. | 364/900 |
| 4,327,410 | 4/1982 | Patel et al. | 395/489 |
| 4,460,982 | 7/1984 | Gee et al. | 365/185.19 |
| 4,472,790 | 9/1984 | Burk et al. | 364/900 |
| 4,489,380 | 12/1984 | Carey et al. | 395/425 |
| 4,521,853 | 6/1985 | Guttag | 395/425 |
| 4,545,030 | 10/1985 | Kitchin | 395/550 |
| 4,648,076 | 3/1987 | Schrenck | 365/189.01 |
| 4,665,506 | 5/1987 | Cline et al. | 365/189 |
| 4,698,750 | 10/1987 | Wilkie et al. | 365/218 |
| 4,701,886 | 10/1987 | Sakakibara et al. | 365/189.07 |
| 4,796,235 | 1/1989 | Sparks et al. | 365/189.07 |
| 4,811,293 | 3/1989 | Knothe et al. | 365/189.05 |
| 4,811,294 | 3/1989 | Kobayashi et al. | 365/185.22 |
| 4,821,240 | 4/1989 | Nakamura et al. | 365/228 |
| 4,823,308 | 4/1989 | Knight | 380/4 |
| 4,835,728 | 5/1989 | Si et al. | 395/550 |
| 4,845,712 | 7/1989 | Sanner et al. | 371/25.1 |
| 4,901,273 | 2/1990 | DiGiulio | 395/725 |
| 4,931,997 | 6/1990 | Mitsuishi et al. | 365/218 |
| 4,974,208 | 11/1990 | Nakamura et al. | 365/228 |
| 4,975,870 | 12/1990 | Knicely et al. | 395/425 |
| 4,975,878 | 12/1990 | Boddu et al. | 365/189.07 |
| 5,014,191 | 5/1991 | Padgaonkar et al. | 395/425 |
| 5,034,922 | 7/1991 | Burgess | 365/189.07 |

(List continued on next page.)

FOREIGN PATENT DOCUMENTS

| | | |
|---|---|---|
| 58-169395 | 10/1983 | Japan . |
| 62-52798 | 3/1987 | Japan . |
| 62-164299 | 7/1987 | Japan . |
| 62-205599 | 9/1987 | Japan . |
| 62-236199 | 10/1987 | Japan . |
| 62-298096 | 12/1987 | Japan . |

OTHER PUBLICATIONS

–Kendall L. Su, "Fundamentals of Circuits, Electronics, and Signal Analysis," pp. 534 and 537.

28F256, Memory Components Handbook, pp. 5-2—5-11 (Intel 1990).

*Primary Examiner*—Jack A. Lane

*Attorney, Agent, or Firm*—Blakely, Sokoloff, Taylor & Zafman

[57] ABSTRACT

A circuit for selectively protecting data stored within a range of addresses from programming and erasing. The circuit includes a circuit for generating an active lock signal. The circuit generates an active lock signal when a protect signal is active and an address signal represents an address within the protected range. Both erasure and programming are prevented while the lock signal is active. Programming and erasure of protected data is permitted while the lock signal is inactive. A method for selectively protecting data within a range of addresses on a non-volatile semiconductor memory from programming or erasure is also described.

8 Claims, 15 Drawing Sheets

U.S. PATENT DOCUMENTS

| | | | |
|---|---|---|---|
| 5,036,488 | 7/1991 | Motarjemi | 365/52 |
| 5,049,814 | 9/1991 | Walker, III et al. | 371/25.1 |
| 5,053,990 | 10/1991 | Kreifels et al. | 395/430 |
| 5,070,443 | 12/1991 | Priem et al. | 395/725 |
| 5,073,873 | 12/1991 | Nogami | 365/189.05 |
| 5,097,445 | 3/1992 | Yamauchi | 365/195 |
| 5,119,336 | 6/1992 | Itoh | 365/195 |
| 5,126,975 | 6/1992 | Handy et al. | 365/230.01 |
| 5,172,338 | 12/1992 | Mehrotra et al. | 365/185 |
| 5,173,876 | 12/1992 | Kawashima et al. | 365/195 |
| 5,175,840 | 12/1992 | Sawase et al. | 395/425 |
| 5,197,034 | 3/1993 | Fandrich et al. | 365/227 |
| 5,222,046 | 6/1993 | Kreifels et al. | 365/230.06 |
| 5,224,070 | 6/1993 | Fandrich et al. | 365/185.33 |
| 5,243,575 | 9/1993 | Sambandan et al. | 365/233.5 |
| 5,307,470 | 4/1994 | Kataoka et al. | 395/425 |
| 5,333,300 | 7/1994 | Fandrich | 395/430 |
| 5,355,464 | 10/1994 | Fandrich et al. | 365/218 |

FIG_1
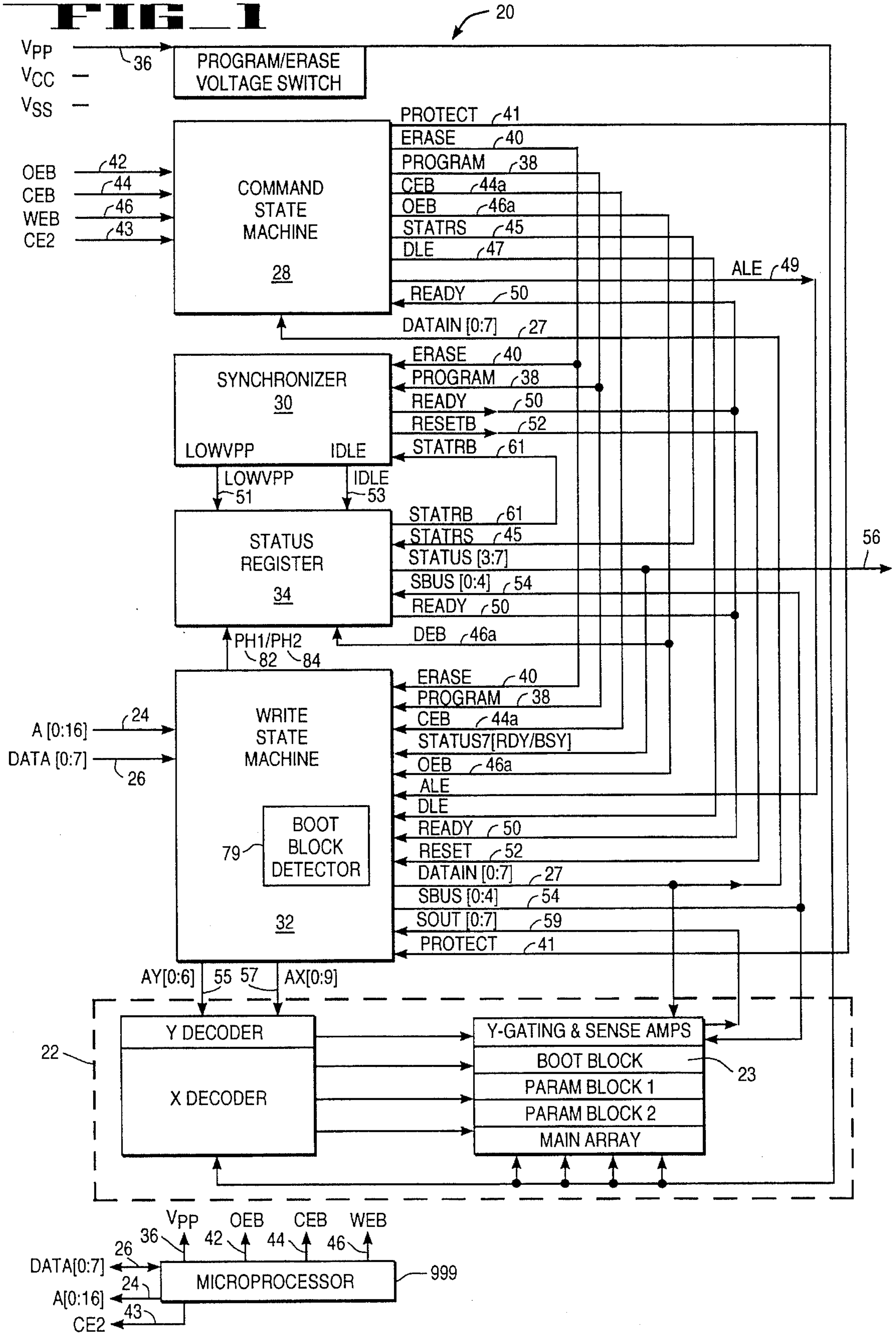

FIG_2

TABLE I

| COMMAND | BUS CYCLES REQUIRED | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | BA | 20H | WRITE | BA | D0H |
| PROGRAM SETUP/PROGRAM | 2 | WRITE | X | 40H | WRITE | PA | PD |

FIG_3 WRITE STATE MACHINE BLOCK DIAGRAM
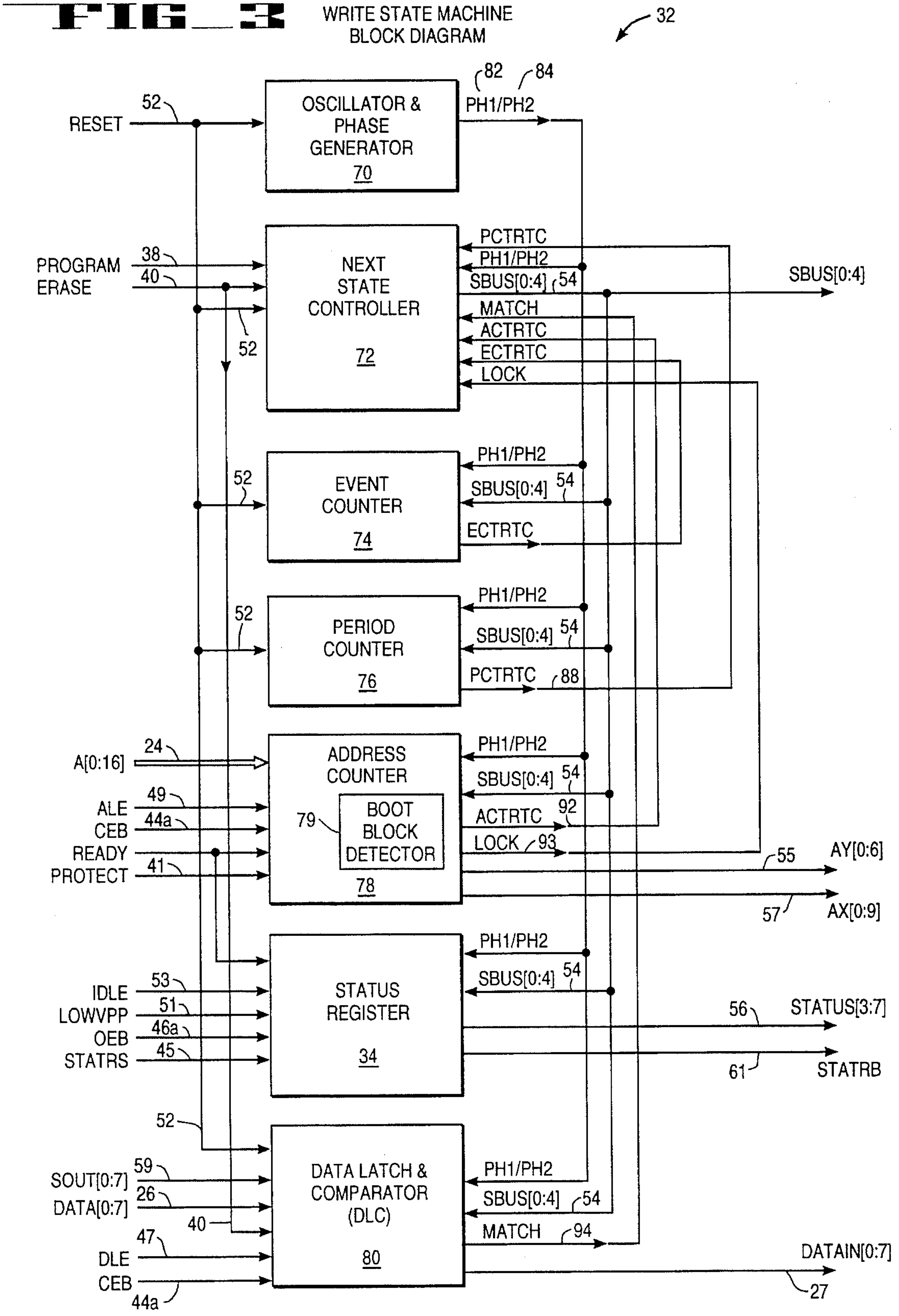

FIG_4 NEXT STATE CONTROLLER
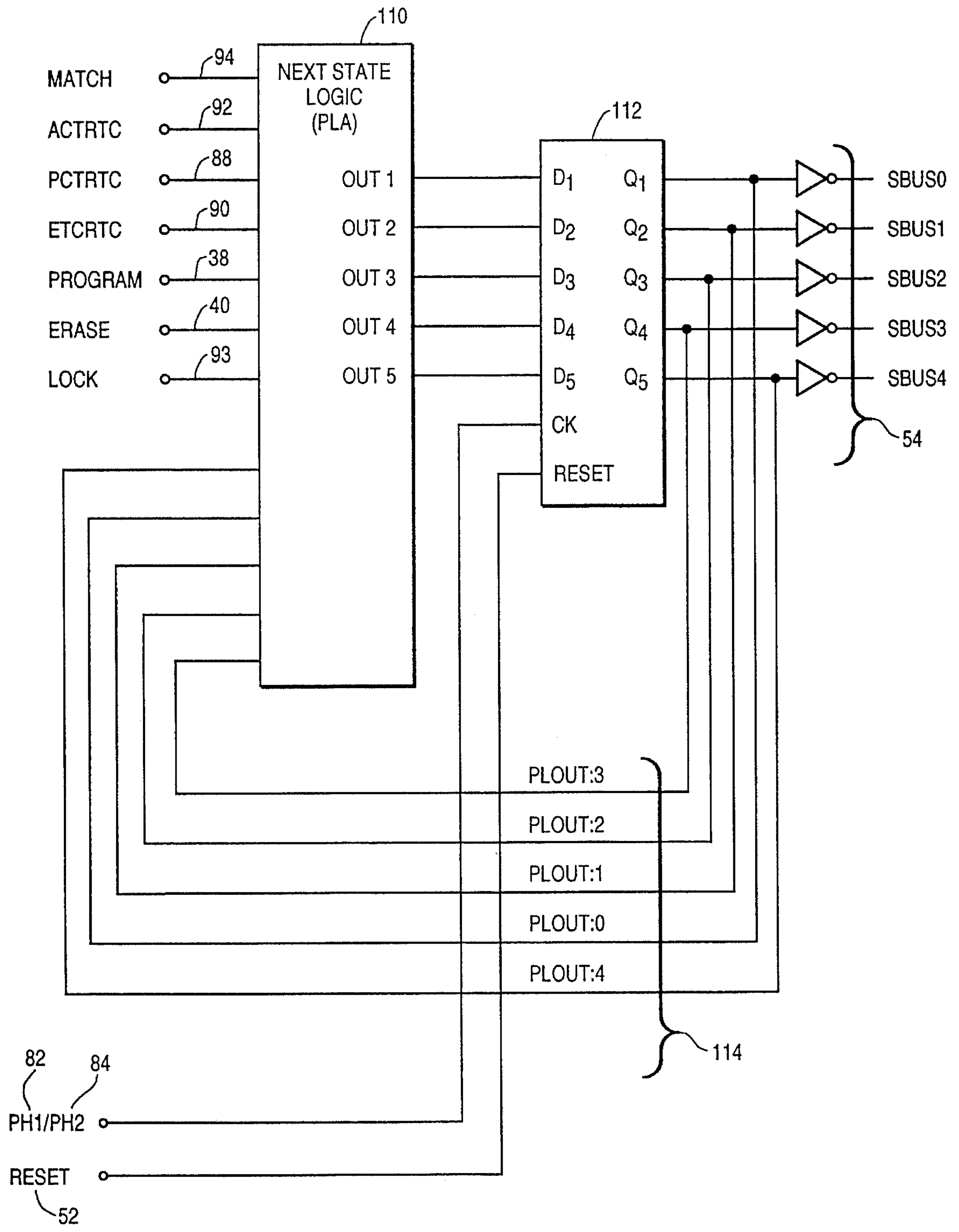

FIG_5A
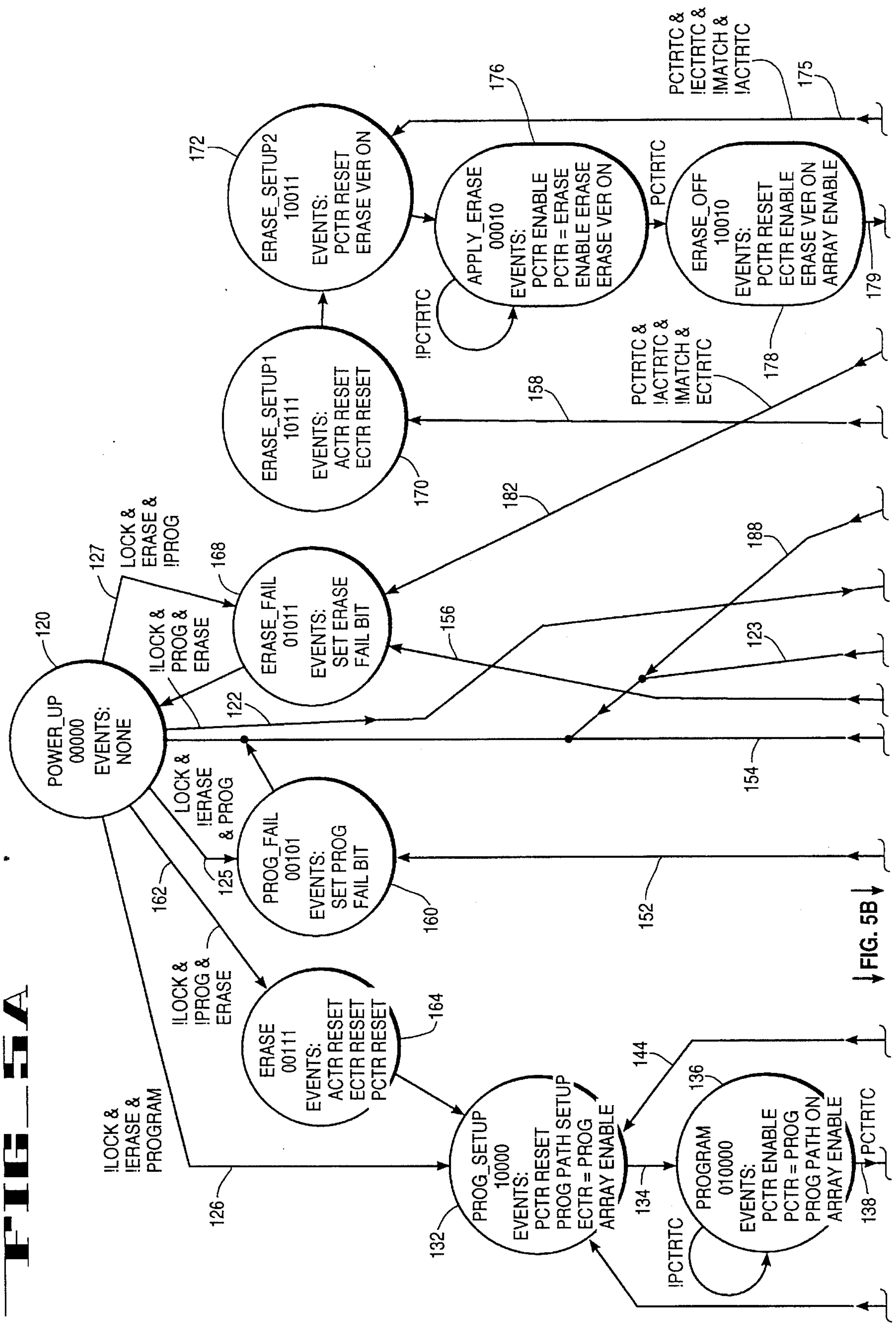

FIG_6

TABLE II

| SBUS | ECTRST | ECTREN | ECTRER | ECTRPG | PCTRST | PCTSELERS | PCTSELPGM | PCTSELVER | DE | CMPEN | COMPDAT1 | READY | ERSFAIL | PRGFAIL | ACTRRST | ACTEN | PGSETUP | PGM | ERASE | ERVER | PGVER | AE | STATE NAME |
|---|---|---|---|---|---|---|---|---|---|---|---|---|---|---|---|---|---|---|---|---|---|---|---|
| 00000 | - | - | 0 | 0 | 0 | 0 | 0 | 0 | 0 | - | - | 0 | 0 | 0 | 0 | 0 | 0 | 0 | 0 | 0 | 0 | 0 | POWER_UP |
| 00010 | 0 | 0 | 0 | 0 | 0 | 1 | 0 | 0 | 0 | - | - | 0 | 0 | 0 | 0 | 0 | 0 | 0 | 1 | 1 | 0 | 0 | APPLY_ERASE |
| 00011 | 1 | - | 0 | 0 | 1 | 0 | 0 | 0 | 0 | - | - | 0 | 0 | 0 | 0 | 0 | 0 | 0 | 0 | 0 | 0 | 0 | ERASE |
| 00101 | - | - | 0 | 0 | - | 0 | 0 | 0 | 0 | - | - | 0 | 0 | 1 | 0 | 0 | 0 | 0 | 0 | 0 | 0 | 0 | PROG_FAIL |
| 01000 | 0 | 0 | 0 | 0 | 0 | 0 | 1 | 0 | 0 | - | 0 | 0 | 0 | 0 | 0 | 0 | 0 | 1 | 0 | 0 | 0 | 1 | PROGRAM |
| 01001 | 1 | - | 0 | 0 | - | 0 | 0 | 0 | 0 | - | - | 0 | 0 | 0 | 0 | 1 | 0 | 0 | 0 | 0 | 0 | 1 | PROG_INC_ADD |
| 01011 | - | - | 0 | 0 | - | 0 | 0 | 0 | 0 | - | - | 0 | 1 | 0 | 0 | 0 | 0 | 0 | 0 | 0 | 0 | 0 | ERASE_FAIL |
| 01100 | 0 | 0 | 0 | 0 | 0 | 0 | 0 | 0 | 1 | 1 | 1 | 0 | 0 | 0 | 0 | 1 | 0 | 0 | 0 | 1 | 0 | 1 | ERASE_INC_ADD |
| 01101 | 0 | 0 | 0 | 0 | 0 | 0 | 0 | 0 | 1 | 1 | 1 | 0 | 0 | 0 | 0 | 0 | 0 | 0 | 0 | 0 | 1 | 1 | ERASE_INC_DELAY |
| 01110 | 0 | 0 | 1 | 0 | 0 | 0 | 0 | 1 | 1 | 1 | 1 | 0 | 0 | 0 | 0 | 0 | 0 | 0 | 0 | 1 | 0 | 1 | ERASE_VERIFY |
| 01111 | 0 | 0 | 0 | 1 | 0 | 0 | 0 | 1 | 1 | 1 | 0 | 0 | 0 | 0 | 0 | 0 | 0 | 0 | 0 | 0 | 1 | 1 | PROG_VER_DELAY |
| 10000 | 0 | 0 | 0 | 0 | 1 | 0 | 0 | 0 | 0 | - | 0 | 0 | 0 | 0 | 0 | 0 | 1 | 0 | 0 | 0 | 0 | 1 | PROG_SETUP |
| 10001 | 0 | 1 | 0 | 0 | 1 | 0 | 0 | 0 | 0 | - | 0 | 0 | 0 | 0 | 0 | 0 | 0 | 0 | 0 | 0 | 1 | 1 | PROG_EQ |
| 10010 | 0 | 1 | 0 | 0 | 1 | 0 | 0 | 0 | 0 | - | 0 | 0 | 0 | 0 | 0 | 0 | 0 | 0 | 0 | 1 | 0 | 1 | ERASE_OFF |
| 10011 | 0 | 0 | 0 | 0 | 1 | 0 | 0 | 0 | 0 | - | - | 0 | 0 | 0 | 0 | 0 | 0 | 0 | 0 | 1 | 0 | 0 | ERASE_SETUP2 |
| 10100 | 0 | 0 | 0 | 0 | 1 | 0 | 0 | 0 | 0 | - | - | 0 | 0 | 0 | 0 | 0 | 0 | 0 | 0 | 0 | 0 | 0 | ERASE_IDLE |
| 10110 | 0 | 0 | 0 | 0 | 1 | 0 | 0 | 0 | 0 | 0 | - | 0 | 0 | 0 | 0 | 0 | 0 | 0 | 0 | 0 | 0 | 0 | PROGRAM_DONE1 |
| 10111 | 1 | - | 0 | 0 | - | 0 | 0 | 0 | 0 | - | 0 | 0 | 0 | 0 | 1 | 0 | 0 | 0 | 0 | 0 | 0 | 0 | ERASE_SETUP1 |
| 11000 | - | - | 0 | 0 | - | 0 | 0 | 0 | - | - | 0 | 0 | 1 | 1 | - | - | 0 | 0 | 0 | 0 | 0 | - | HARDWARE_ERRS |
| 11001 | - | - | 0 | 0 | - | 0 | 0 | 0 | - | - | 0 | 0 | 1 | 1 | - | - | 0 | 0 | 0 | 0 | 0 | - | |
| 11010 | - | - | 0 | 0 | - | 0 | 0 | 0 | - | - | 0 | 0 | 1 | 1 | - | - | 0 | 0 | 0 | 0 | 0 | - | |
| 11011 | - | - | 0 | 0 | - | 0 | 0 | 0 | - | - | 0 | 0 | 1 | 1 | - | - | 0 | 0 | 0 | 0 | 0 | - | |
| 11100 | - | - | 0 | 0 | - | 0 | 0 | 0 | - | - | 0 | 0 | 1 | 1 | - | - | 0 | 0 | 0 | 0 | 0 | - | |
| 11101 | - | - | 0 | 0 | - | 0 | 0 | 0 | - | - | 0 | 0 | 1 | 1 | - | - | 0 | 0 | 0 | 0 | 0 | - | |
| 11110 | - | - | 0 | 0 | - | 0 | 0 | 0 | - | - | 0 | 0 | 1 | 1 | - | - | 0 | 0 | 0 | 0 | 0 | - | |
| 11111 | - | - | 0 | 0 | - | 0 | 0 | 0 | - | - | 0 | 0 | 1 | 1 | - | - | 0 | 0 | 0 | 0 | 0 | - | |

FIG_7

TABLE III

| SIGNAL ACRONYM | SIGNAL NAME |
|---|---|
| ECTRST | - EVENT COUNTER RESET |
| ECTREN | - EVENT COUNTER ENABLE |
| ECTRER | - EVENT COUNTER TC OUT = ERASE NOMINAL (2000) |
| ECTRPG | - EVENT COUNTER TC OUT = PROGRAM NOMINAL (50) |
| PCTRST | - PERIOD COUNTER RESET (PCTR RUNS IN ALL STATES RESET IS NOT ASSERTED) |
| PCTSELERS | - PERIOD COUNTER TC OUT = ERASE PULSE WIDTH |
| PCTSELPGM | - PERIOD COUNTER TC OUT = PROGRAM PULSE WIDTH |
| PCTSELVER | - PERIOD COUNTER OUT = 0.5 SECOND ERASE |
| DE | - DATA PATH ENABLE (SENSE AMPS/DRAIN BIAS, ETC.) |
| CMPEN | - COMPARATOR ENABLED |
| COMPDAT1 | - FORCE COMPARATOR DATA TO 1 IF ERASE MODE |
| READY | - SET RDY/BSY# = 1 |
| ERSFAIL | - SET ERASE FAIL BIT |
| PRGFAIL | - SET PROGRAM FAIL BIT |
| ACTRRST | - ADDRESS COUNTER RESET |
| ACTEN | - ADDRESS COUNTER ENABLED FOR COUNTING |
| PGSETUP | - PROGRAM SETUP |
| PGM | - PROGRAM DATA IN |
| ERASE | - APPLY ERASE VOLTAGES |
| ERVER | - TURN ERASE VERIFY CIRCUITRY ON |
| PGVER | - TURN PROGRAM VERIFY CIRCUITRY ON |
| AE | - ENABLE THE ARRAY (X DECODERS, ETC.) |

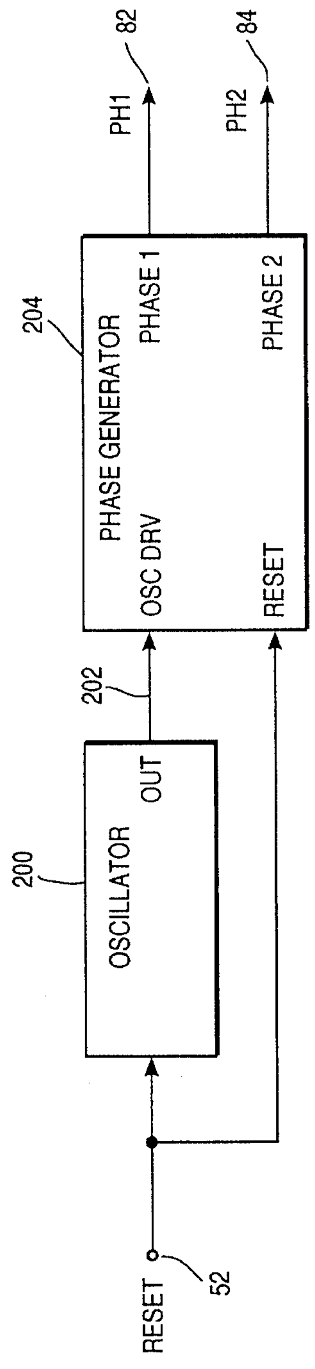
FIG_8
PH1/PH2 START-UP TIMING
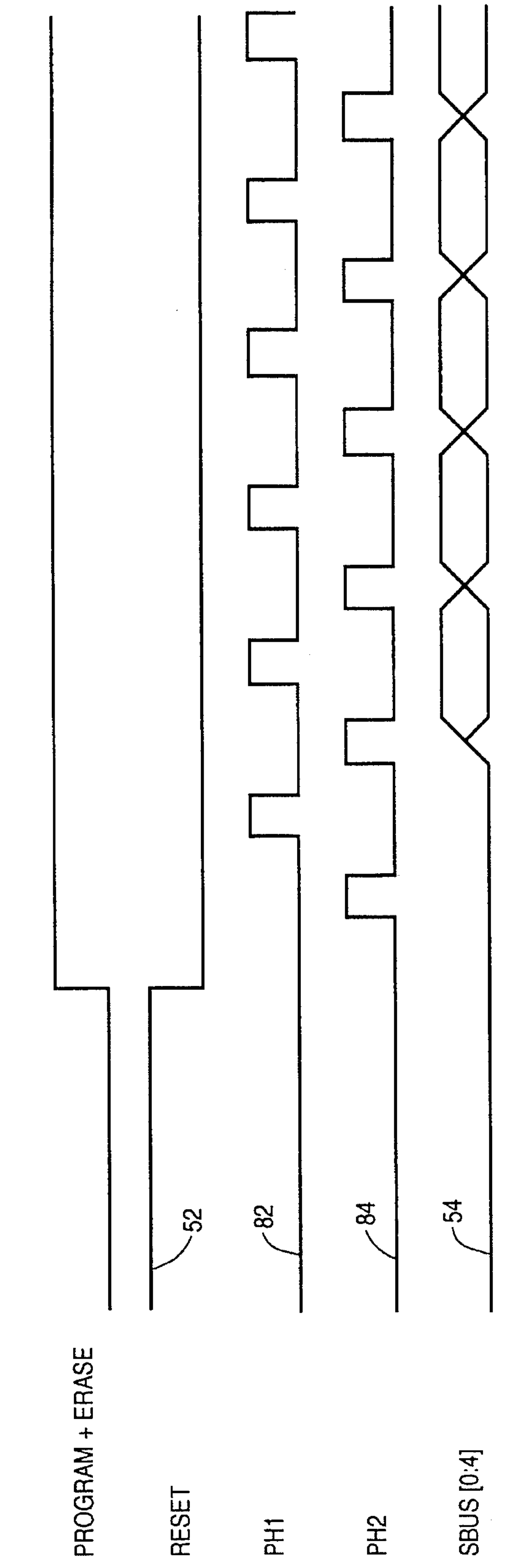
FIG_9

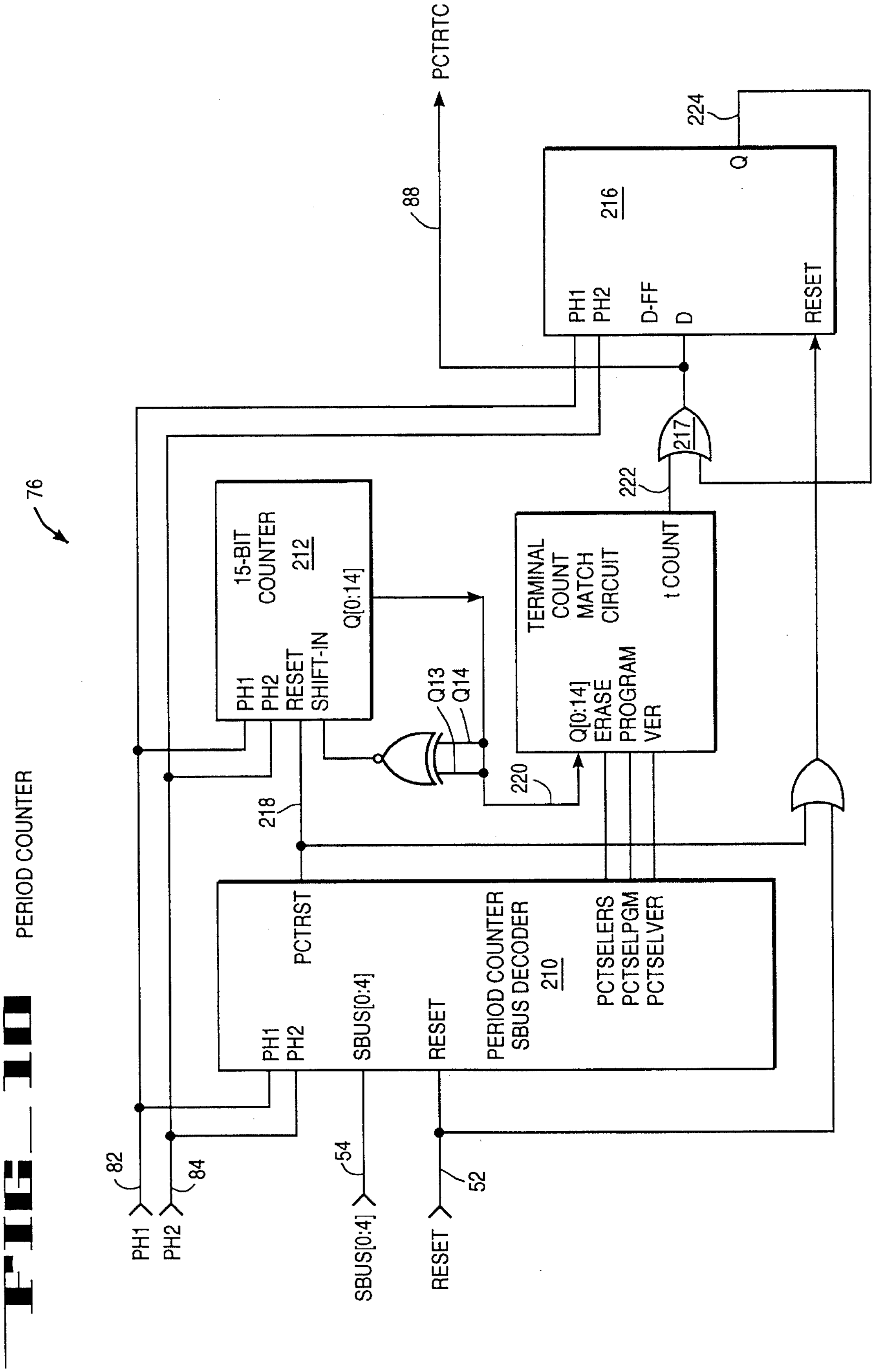
FIG_10 PERIOD COUNTER

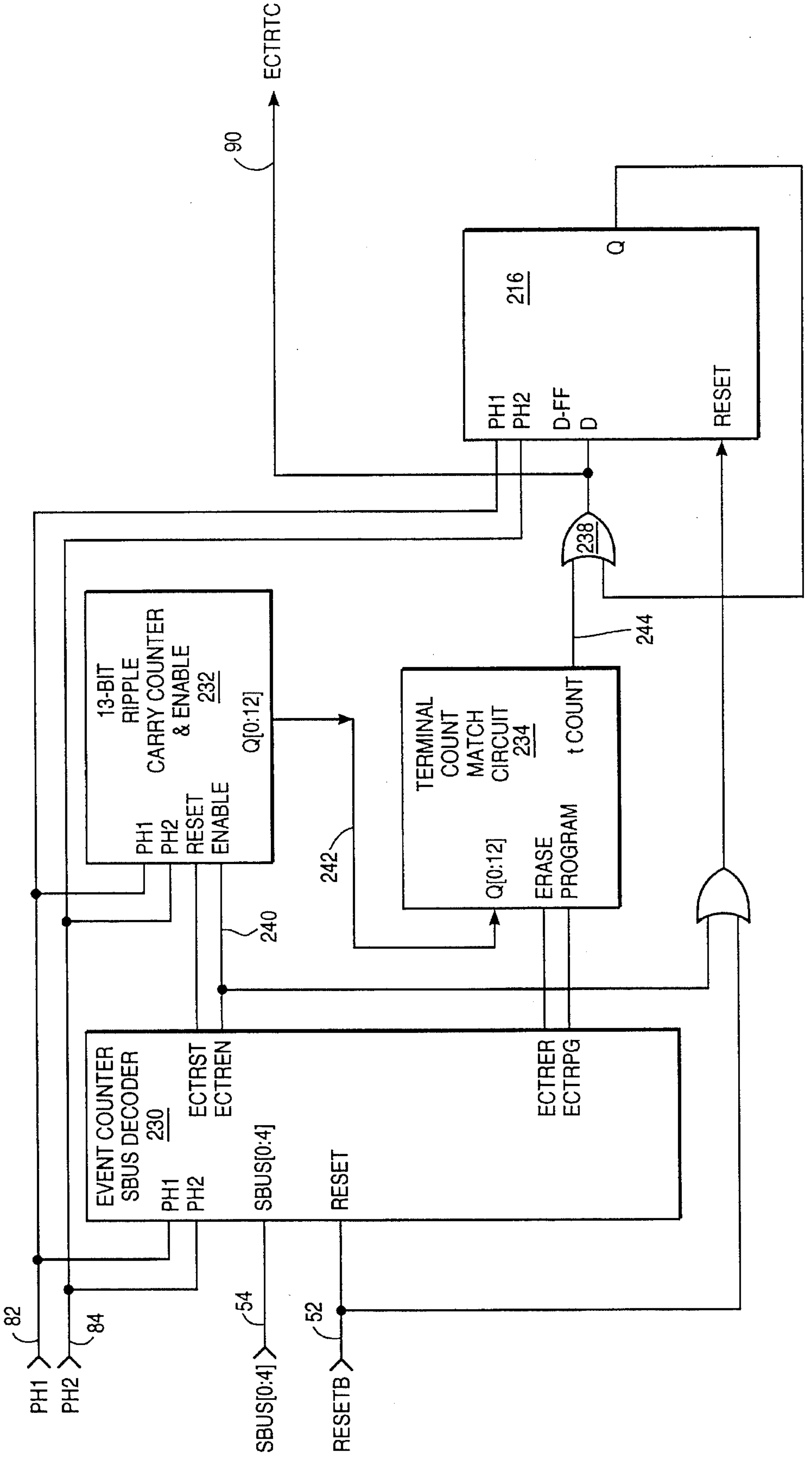
FIG_11 EVENT COUNTER

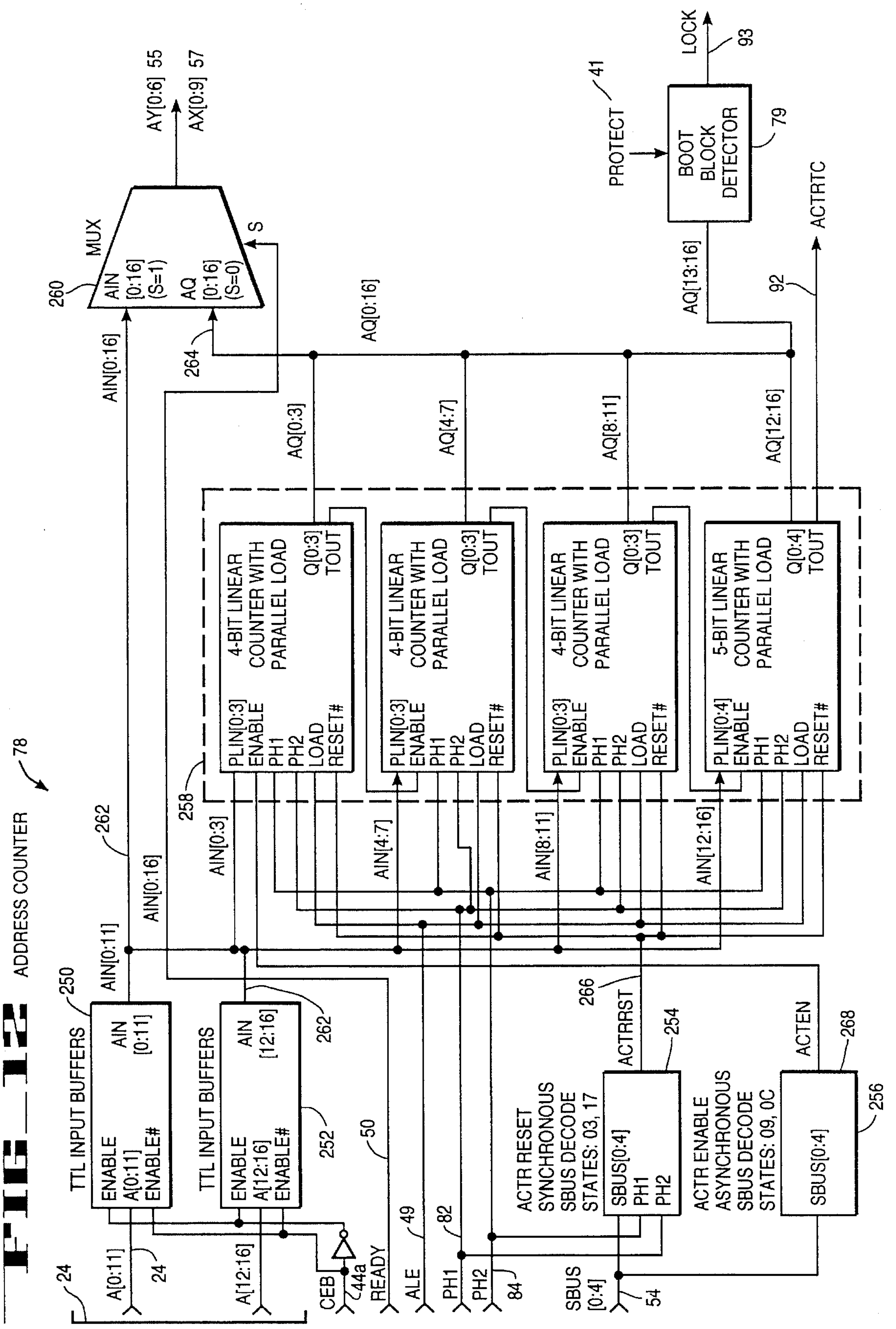
FIG_12

FIG_13 BOOT BLOCK DETECTOR
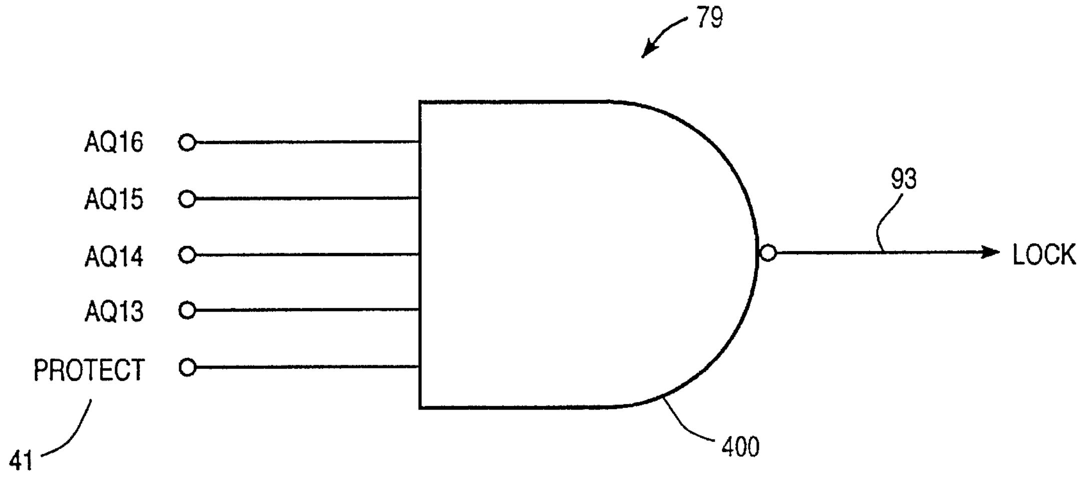
FIG_14 ADDRESS TABLE
| ADDRESS | A16 | A15 | A14 | A13 | |
|---|---|---|---|---|---|
| 1FFFF | 1 | 1 | 1 | 1 | |
| | • | • | • | • | BOOT BLOCK |
| | • | • | • | • | |
| 1E000 | 1 | 1 | 1 | 1 | |
| 1DFFF | 1 | 1 | 1 | 0 | PARAMETER BLOCK 1 |
| 1D000 | 1 | 1 | 1 | 0 | |
| 1CFFF | 1 | 1 | 1 | 0 | PARAMETER BLOCK 2 |
| 1C000 | 1 | 1 | 1 | 0 | |
| 1BFFF | 1 | 1 | 0 | 1 | |
| | 1 | 0 | 1 | | |
| | 1 | 0 | 0 | | |
| | 0 | 1 | 1 | | MAIN BLOCK |
| | 0 | 1 | 0 | | |
| | 0 | 0 | 1 | | |
| 00000 | 0 | 0 | 0 | 0 | |

FIG_15 DATA LATCH & COMPARATOR
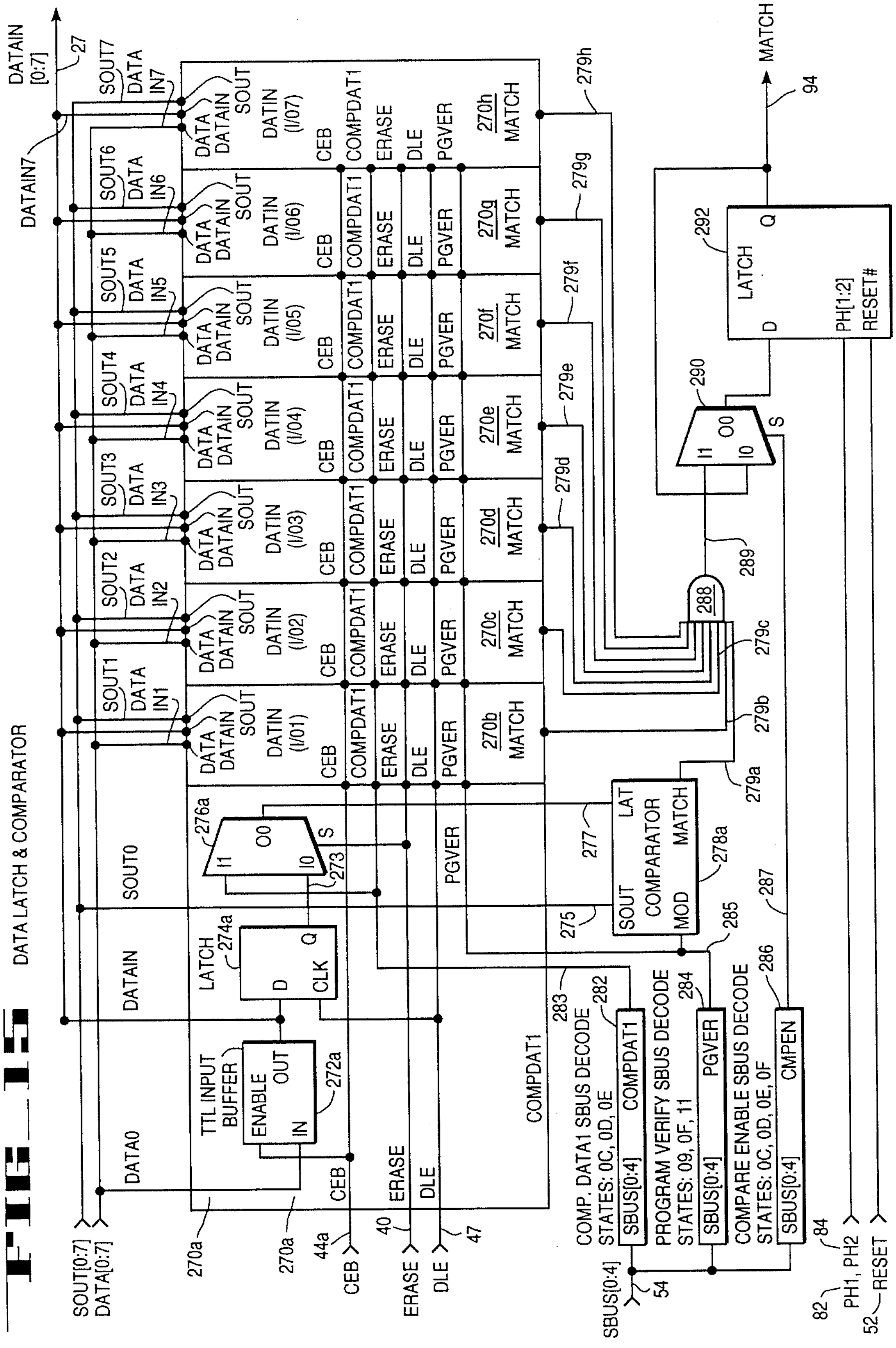

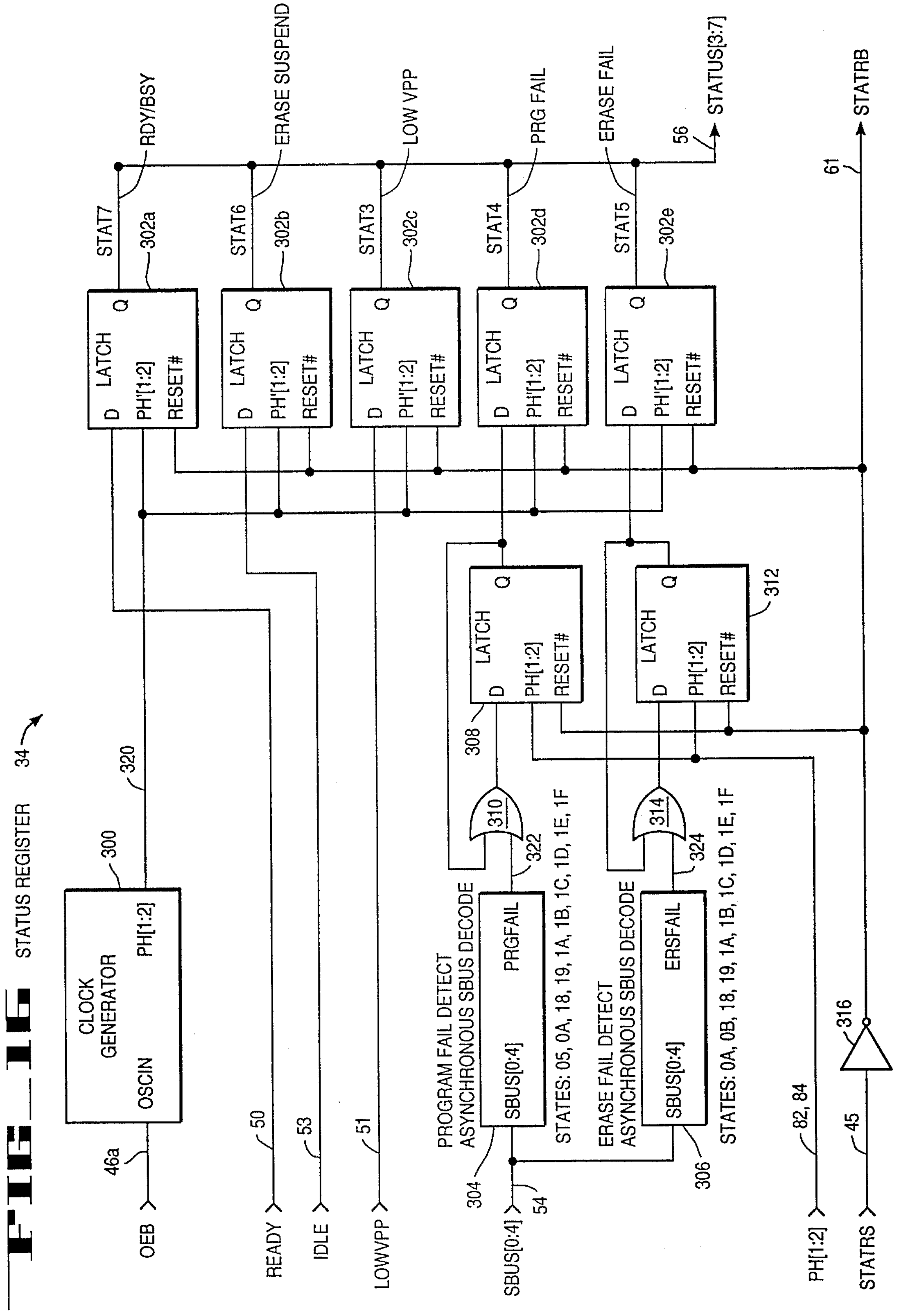
FIG_16
STATUS REGISTER
34
CLOCK GENERATOR
OSCIN
PH[1:2]
300
320
46a
OEB
READY
IDLE
LOWVPP
50
53
51
LATCH
D
Q
PH'[1:2]
RESET#
302a
302b
302c
302d
302e
STAT7
STAT6
STAT3
STAT4
STAT5
RDY/BSY
ERASE SUSPEND
LOW VPP
PRG FAIL
ERASE FAIL
56
STATUS[3:7]
61
STATRB
PROGRAM FAIL DETECT ASYNCHRONOUS SBUS DECODE
SBUS[0:4]
PRGFAIL
STATES: 05, 0A, 18, 19, 1A, 1B, 1C, 1D, 1E, 1F
ERASE FAIL DETECT ASYNCHRONOUS SBUS DECODE
ERSFAIL
STATES: 0A, 0B, 18, 19, 1A, 1B, 1C, 1D, 1E, 1F
304
306
54
SBUS[0:4]
310
314
322
324
308
312
PH[1:2]
82, 84
PH[1:2]
316
45
STATRS

CIRCUITRY AND METHOD FOR SELECTIVELY PROTECTING THE INTEGRITY OF DATA STORED WITHIN A RANGE OF ADDRESSES WITHIN A NON-VOLATILE SEMICONDUCTOR MEMORY

RELATED APPLICATION

This application is a continuation of Ser. No. 08/197,364 filed Feb. 15, 1994, now abandoned, which is a continuation of Ser. No. 07/698,721 filed May 10, 1991, now abandoned, which is a continuation-in-part of Ser. No. 07/654,375 filed Feb. 11, 1991, abandoned.

FIELD OF THE INVENTION

The present invention pertains to the field of non-volatile semiconductor memories. More particularly, the present invention relates to circuitry and a method for selectively protecting data within a range of addresses within a non-volatile semiconductor memory from programming or erasing.

BACKGROUND OF THE INVENTION

One type of prior non-volatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM may be programmed with new code or data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells.

For one prior flash EEPROM, a logical "one" means that few if any electrons are stored on a floating gate associated with a bit cell. A logical "zero" means that many electrons are stored on the floating gate associated with the bit cell. Erasure of prior flash memory devices causes a logical one to be stored in each bit cell. Each single bit cell of a flash memory cannot be overwritten from a logical zero to a logical one without a prior erasure. Each single bit cell of that flash memory can, however, be overwritten from a logical one to a logical zero, given that this entails simply adding electrons to a floating gate that contains the intrinsic number of electrons associated with the erased state.

Due to the nature and design of a typical flash memory device, the entire device must be erased in order to erase any one cell in that device. This exposes the data in the memory device to potential data loss or corruption due to the erasure and reprogramming process whenever a portion of the data needs to be erased and reprogrammed.

One type of flash memory includes array blocking. Flash memory array blocking allows segregating different portions or types of data. In this way, when one portion needs to be erased, the other portion(s) do not have to be erased and are therefore not exposed to potential data loss or corruption. Thus, flash memory array blocking provides an increased level of data integrity previously achieved through the use of multiple chips each containing a different portion or type of data.

One prior flash EEPROM is the 28F256 complementary metal oxide semiconductor ("CMOS") flash memory sold by Intel Corporation of Santa Clara, Calif., which is a 256 kilobit flash EEPROM. The 28F256 flash memory includes a command register to manage electrical erasure and reprogramming. Commands are written to the command register from a controlling microprocessor using standard microprocessor write timings. The command register contents serve as input to an internal state machine that controls erase and programming circuitry.

The controlling microprocessor controls the erasure and programming of the flash memory. A prior Quick-Erase™ algorithm of Intel Corporation can be used by the microprocessor to erase the flash memory. The prior Quick-Erase™ algorithm requires that all bits first be programmed to their charged state, which is data equal to 00 (hexidecimal). Erasure then proceeds by pulling the source of the transistors in the array up to a high voltage level for a period of 10 msec, while keeping the transistor gates at zero volts. After each erase operation, byte verification is performed. The prior Quick-Erase™ algorithm allows up to 3000 erase operations per byte to recognize erasure failure. Proper device operation requires that the erasure procedure be strictly followed.

The prior Quick-Pulse Programming™ algorithm of Intel Corporation can be used by the microprocessor to then program the flash memory. The Quick-Pulse Programming™ algorithm requires that a programming pulse of a specific duration and voltage level be applied to the gate and drain of the selected transistors in the array. For example, for certain prior Intel flash memories a programming pulse of 10 μsec has been suggested while Vpp is held at 12.75. After the programming pulse is applied, the user must verify whether the memory cell addressed is properly programmed. If not properly programmed, a programming pulse may be reapplied a number of times before a programming error is recognized. Intel's Quick-Pulse Programming™ algorithm allows up to 25 programming operations per byte. Proper and reliable operation of the flash memory mandates that the programming procedure be strictly followed.

One disadvantage of the prior way of using a microprocessor to control erasure and programming of the flash memory is that it ties up the microprocessor, thus requiring a relatively high level of microprocessor overhead. This, in turn, decreases system throughput.

Another disadvantage of the prior way of using a controlling microprocessor to control the erasure and programming of the flash memory is the relatively high complexity of typical erasure/programming software. This complex software requires a relatively high level of user sophistication. Moreover, this complex software increases the likelihood of a customer error, such as over-erasure of the flash memory.

One disadvantage of prior flash memories is that certain portions of data could not be selectively protected from accidental erasure or programming.

SUMMARY AND OBJECTS OF THE INVENTION

One of the objects of the present invention is to provide circuitry and method for selectively preventing the programming and erasing of data within a range of addresses within a non-volatile semiconductor memory.

Circuitry for selectively protecting data stored at a protected address within a non-volatile semiconductor memory from erasure or programming is described. The circuitry includes signal means for generating a lock signal which provides an active lock signal while an address signal represents a protected address and a protect signal is active. A means for preventing erasure or programming receives the lock signal and prevents programming or erasure of data at the protected address while the lock signal is active.

A method for selectively protecting data stored at a particular address within a non-volatile semiconductor memory is also described. The data at the particular address is protected from programming and erasure while a lock signal is active. An address signal is received, as well as a protect signal, An active lock signal is generated while the protect signal is active and the address signal represents the protected address.

Other objects, features, and advantages of the present invention will be apparent from the accompanying drawings and from the detailed description that follows below.

BRIEF DESCRIPTION OF DRAWINGS

The present invention is illustrated by way of example and not by way of limitation in the figures of the accompanying drawings in which like references indicate like elements and in which:

FIG. 1 is a block diagram of circuitry of a flash memory, including a boot block detector;

FIG. 2 illustrates Table I, which lists flash memory commands;

FIG. 3 is a block diagram of the write state machine;

FIG. 4 is a block diagram of the circuitry of next state to controller;

FIGS. 5A and 5B are a state diagram of the method of programming and erasing flash memories;

FIG. 6 illustrates Table II, which lists SBUS values for each write state machine state;

FIG. 7 illustrates Table III, which lists signal names;

FIG. 8 is a block diagram of the oscillator and phase generator;

FIG. 9 is a start-up timing diagram for PH1 and PH2;

FIG. 10 is a block diagram of the period counter;

FIG. 11 is a block diagram of the event counter;

FIG. 12 is a block diagram of the address counter;

FIG. 13 is a schematic diagram of the boot block detector;

FIG. 14 is an address table;

FIG. 15 is a block diagram of the data latch and comparator;

FIG. 16 is a block diagram of the status register.

DETAILED DESCRIPTION

Figure 5B:
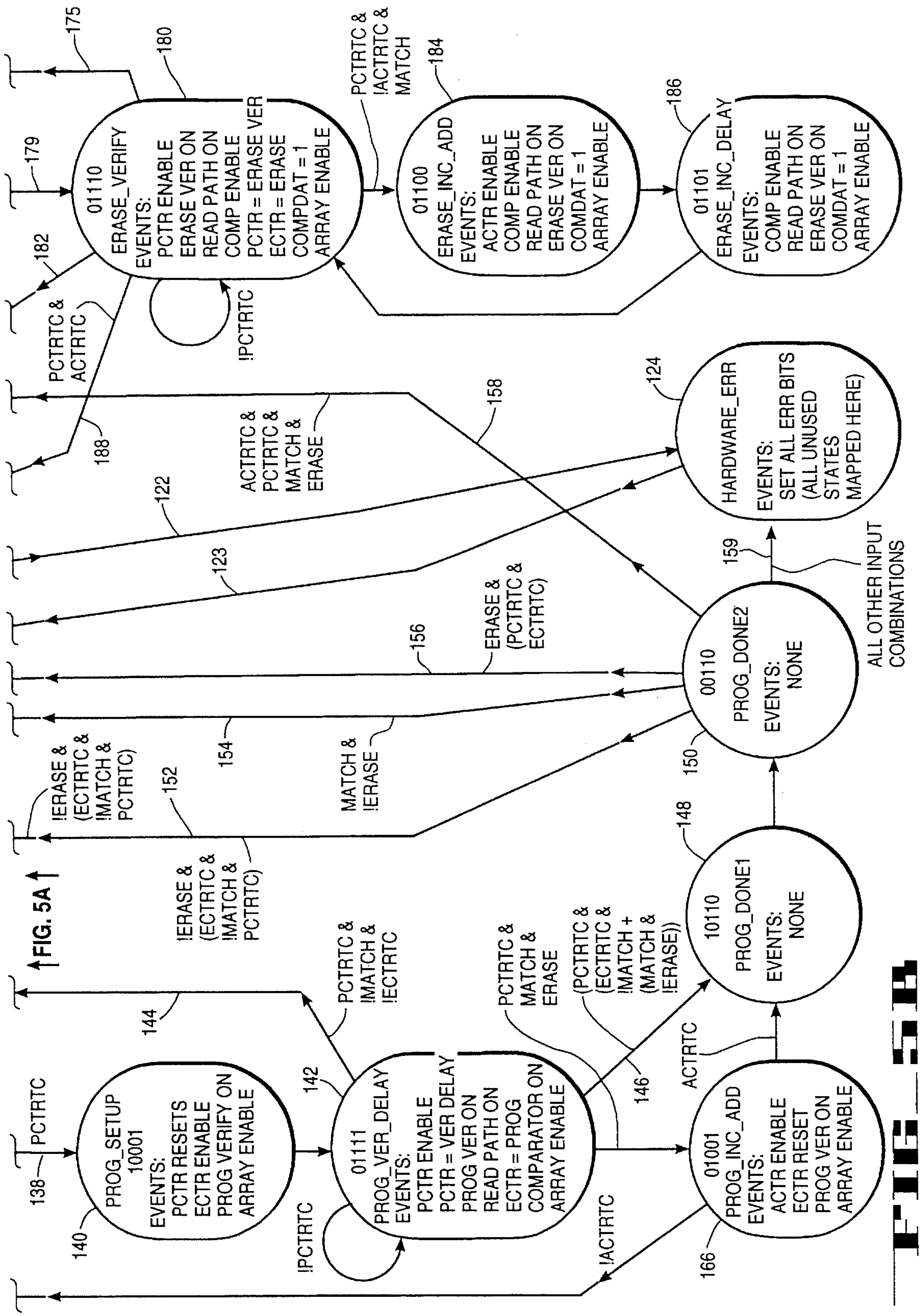

FIG. 1 illustrates in block diagram form the circuitry of flash EPROM 20, which is a preferred embodiment of the present invention. Flash EPROM 20 is also referred to as flash memory 20.

As described in more detail below, flash EPROM 20 includes a boot block detector 79, located within the write state machine 32. Boot block detector 79 prevents the programming or erasure of the boot block 23 of the memory array 22 unless the boot block 23 is "unlocked" by the microprocessor 999. Microprocessor 999 may unlock the boot block 23 by bringing the voltage on CE2 pin 43 up to 12 volts.

Vpp 36 is the erase/program power supply voltage for the flash memory. Vcc is the device power supply for flash memory 20 and Vss is ground. In one embodiment, Vpp 36 is 12.0 volts and Vcc is approximately 5 volts.

In the absence of high voltage on Vpp 36, flash memory 20 acts as a read-only memory. The data stored at an address supplied via lines 24 is read from memory array 22 and made available via data input/output lines 26 to the circuitry external to the flash memory 20.

Flash memory 20 has three control signals: chip-enable bar CEB 44, WEB 46, and output-enable bar OEB 42. The chip-enable bar CEB 44 input is the power control and is used to select flash memory 20. CEB 44 is active low. The output-enable bar input OEB 42 is the output control for flash memory 20 and is used to gate data from the output pins from flash memory 20. OEB 42 is active low. Both control signals CEB 44 and OEB 42 must be logically active to obtain data at the data lines 26 of flash memory 20.

The write enable bar signal, WEB 46, allows writes to command state machine 28 while CEB 44 is low. Write enable bar signal 46 is active low. Addresses and data are latched on the rising edge of WEB 46. Standard microprocessor timings are used.

The second chip enable signal, CE2 43 allows the contents of the boot block 23 to be programmed or erased when CE2 43 is brought up to 12 volts. Unless CE2 43 is at 12 volts, the data stored within the boot block 23 may not be altered by programming or erasure. In other words, the boot block 23 is locked until it is unlocked by pulling CE2 43 up to 12 V.

Device operations are selected by writing specific data patterns into the flash memory via data input/output lines 26. Table I of FIG. 2 defines certain commands.

SRD in Table I represents data read from the status register 34. PA in Table I represents the address of the memory location to be programmed and PD represents the data to be programmed at address PA. BA represents any address within the block to be erased.

Erase operations are performed on memory array 22 in response to a two-cycle erase command sequence. An erase-setup command is first written, accompanied by any address within the block which is chosen to be erased. This is followed by the erase-confirm command, also accompanied by a block address, preconditioning, erase and erase verification are all handled internally by the write state machine, invisible to the microprocessor 999. The erase operation takes approximately 1 second.

This two step erase, set-up followed by execution, ensures that block memory contents are not accidentally erased. Erasure can occur only when high voltage is applied to Vpp. In the absence of this high voltage, the memory contents are protected against erasure. The CE2 signal 43 provides even greater protection for the boot block 23. The boot block 23 may only be erased while CE2 is at 12 V.

The erase event involves two major tasks: preconditioning and erasing. Preconditioning the selected block of the memory array 22 by bringing cell voltages to approximately 6.75 volts protects the longevity of the block by preventing cell voltages during erasure from dropping to levels that could result in cell leakage. Block erasure brings cell voltages to approximately 3.25 volts, a logic 1.

The microprocessor 999 can detect the completion of an erase operation by issuing a Read Status Register command and analyzing the status data. When the status register 34 indicates that the erase operation is complete, the erase failure status bit should be checked. After examination the status register 34 error bits should be cleared as appropriate. Other operations can be executed only after receipt of the appropriate command.

Programming is also executed by a two-cycle command sequence. The Program Set-up command is written to the command state machine 28 via data lines 26, followed by a second write command specifying the address and data to be programmed. The write state machine 32 then takes over, controlling the program and verify algorithms internally. Polling the status register 34 with the Status Register Read command allows microprocessor 999 determine when the programming operation is complete. Only the Read Status Register command is valid while programming operation is ongoing.

When the status register 34 indicates that a programming operation is complete, the program fail bit should be checked. After examination, the microprocessor 999 should clear the status register error bits as appropriate.

In a preferred embodiment, the circuitry of flash memory 20 shown in FIG. 1 is on a single substrate. In a preferred embodiment, flash memory 20 employs CMOS circuitry.

Flash memory 20 includes a memory array 22, which includes 4 blocks of memory, as well as a read path, a write path and verification circuitry, which are not illustrated. Flash memory array blocking allows segregating different portions or types of data. In this way, when one block needs to be erased, the other block(s) do not have to be erased and are therefore not exposed to potential data loss or corruption. Thus, flash memory array blocking provides an increased level of data integrity previously achieved through the use of multiple chips each containing a different portion or type of data. Boot block locking provides even greater data integrity for boot code.

Referring to FIG. 1, each block of the subdivided memory array 22 is intended to be used for a different function. The three functions intended to be supported by the present invention are a boot block 23, a parameter area, and a main block or application space. The boot block 23 holds the code needed to boot processor 999. The parameter area, parameter block 1 and parameter block 2, holds parameter information as needed by whatever application the flash memory device is supporting. The main block or application space contains the application code itself.

Flash memory 20 includes on-chip command state machine ("CSM") 28, synchronizer 30, write state machine ("WSM") 32 and status register 34.

Commands to program or erase memory array 22 are applied via data lines 26. The data on data lines 26 is passed on to command state machine 28. The command state machine 28 decodes the data and if it represents an erase, program or status register reset command, the CSM 28 begins generating the appropriate control signals. The control signals provided by the command state machine 28 to the write state machine 32 include PROGRAM 38, ERASE 40, status register reset signal STATRS 45, address latch enable ALE 49, and data latch enable signal DLE 47.

The program and erase algorithms are regulated by the write state machine 32, including program pulse repetition where required and internal verification of data, as will be discussed in detail herein below.

Write state machine 32 latches in the necessary address and data needed to perform erase and program operations from inputs A[0:16] 24 and D[0:7]26. The operation of the write state machine's address and data latches is controlled respectively by address latch enable signal ALE 49 and data latch enable signal DLE 47 from the CSM 28.

The write state machine 32 interfaces with memory array 22 via array address signals AY[0:6] 55 and AX[0:9 57 and sense amp outputs SOUT[0:7] 59, which represent the data stored at the addressed memory location. When it is active, write state machine 32 controls the read path, the write path and the verification circuitry of memory array 22 via SBUS [0:4] 54.

Write state machine 32 32 reports its status during operation to synchronizer 30 and status register 34 via SBUS [0:4] 54.

The synchronizer 30 provides synchronization between the write state machine 32 and the command state machine 28. Upon receipt of either an active ERASE 40 or PROGRAM 38 signal, synchronizer 30 forces the READY signal 50 to a logic low, indicating to the command state machine 28 and the status register 34 that the write state machine 32 is busy. When the write state machine 32 completes its operation, synchronizer 30 shuts down the write state machine 32 by setting READY.

The synchronizer 30 resets the write state machine 32 whenever ERASE 38 and PROGRAM 40 go to a logic low by forcing RESET signal 52 to a logic high.

The synchronizer 30 also reports to the status register, providing information about the status of write state machine 32 operation via LOWVPP 51.

The status register 34 decodes SBUS [0:4] 54 and indicates to the microprocessor 999 whether an operation is complete or not and its success via STATUS outputs 56. STATUS outputs 56 are multiplexed onto the input/output data lines 26.

FIG. 3 illustrates in block diagram form the circuitry of write state machine 32 and its connection to the status register 34. The write state machine 32 includes an oscillator and generator 70, a next state controller 72, an event counter 74, a period counter 76, an address counter 78 and a data latch and comparator ("DLC") 80.

RESET 52 is applied to nearly all circuits within the write state machine 32. RESET 52 forces critical nodes within the write state machine 32 to known states. For example, RESET 52 forces to a logic zero the terminal count signals 88, 90 and 92.

Shortly after receiving an inactive RESET signal 52, the oscillator/phase generator 70 begins generating two non-overlapping phase clocks, phase 1, PH1 82, and phase 2, PH2, which are routed to nearly all of the WSM 32 circuitry. PH2 84 is the first clock active after RESET 52.

Next state controller 72 controls and coordinates the activities of the write state machine 32 and determines the WSM's next state. Next state controller 72 generates the five outputs SBUS[0:4] 54, which indicate the WSM's current state. Next state controller will also prevent program and operations form being executed on the boot block unless the lock signal, lock 93, is inactive.

Each circuit receiving SBUS [0:4] 54 from the next state controller 72 performs its own SBUS [0:4] 54 decode to determine its next task. This design allows many tasks to be performed in parallel, minimizing the time needed it takes to perform erase and program functions.

The period counter 76 determines and times the pulse periods for array voltages during program and erase operations. Another period indicated by period counter 76 is the delay between programming or erasing and verification of valid data from memory cells. By going active-high, the period counter's 76 terminal count signal, PCTRTC 88, informs the next state controller 72 that the selected period of time has elapsed.

The period counter 76 decodes SBUS [0:4] 54 to select the desired pulse period. SBUS [0:4] 54 also causes the period counter 76 to reset its count one state before period counter 76 is to be enabled.

The event counter 74 determines when the maximum number of program or erase operations per byte has been reached. When the maximum number of operations per byte has been reached, the event counters 74 informs the next state controller 72 by bringing the event terminal count signal, ECTRTC 90, to a logic high. The event counter 74 determines the maximum number of operations by decoding the SBUS [0:4] 54. In the preferred embodiment, the maximum number of program operations per byte is set to 50 and the maximum number of erase operations is set to 8192.

Within WSM 32, the address counter 78 functions as both an input buffer and a counter. When READY 50 is high the address at address lines A[0:16] is output as signals AY [0:6] 55 and AX [0:9] 57. Signals AY 55 and AX 57 point to the location of the byte in memory array 22 which is to be programmed, erased or read.

After the address has been input to the input buffers, the address from the input buffers will be loaded into the address counter 78 under the control of CSM 28 via the signal ALE 49. The address counter 78 then counts through all the addresses in the block of selected memory within memory array 20. The address counter 78 indicates to the next state controller 72 that the end of the selected block memory has been reached by forcing its terminal count ACTRTC 92, to a logic one.

Address counter 78 includes boot block detector 79. Boot block detector 79 examines the four most significant bits (MSBs) of the address signal, A[13:16], and determines whether the boot block 23 has been addressed. Boot block detector 79 will generate an active lock signal 93 when the boot block 23 has been selected and the protect signal 41 is active. The boot block 23 cannot be programmed or erased while protect signal 41 is active. The active lock signal 93 indicates to the next state controller 72 that neither programming nor erasure should occur.

The data latch and comparator (DLC) 80 is the interface between the WSM 32 and the command state machine 28, and memory array 22 and data lines 26. TTL data input on data lines 26 is buffered by the DLC 80 and passed on to the command state machine 28 as DATAIN[0:7] 27.

If DATAIN [0:7] 27 represents a program command, the command state machine 28 will direct DLC 80 to store the information on data lines 26 by setting the data latch enable signal DLE 47 to a logic one. During the program operation, the DLC 80 compares the data stored in its latches to sense amp signals, SOUT [0:7] 59, and indicates a match by setting MATCH 94 to a logic high.

The DLC 80 compares the sense amp signals, SOUT [0:7] 59, which are indicative of memory cell contents, to a reference logic level during erase verify procedures and indicates successful erasure to next state controller 72 by setting MATCH 94 to a logic high.

The status register 34 reports the status of the write state machine 32 to the microprocessor 999 via status signals, STAT [3:7] 56, which are multiplexed onto data lines 26. The status register 34 determines the write state machine's status based upon the signals READY 50, LOWVPP51, and SBUS[0:4] 54.

FIG. 4 illustrates in block diagram form the circuitry of next state controller 72. Next state controller 72 includes next state logic 110 and a master slave D-latch 112. In the preferred embodiment, the next state logic 110 is implemented as a programmable logic array.

Next state logic 110 determines the next state of each circuit within the write state machine 32 based upon the write state machine's previous state, as represented by signals PLOUT[0:4] 114, MATCH 94, PROGRAM 38, ERASE 40, LOCK 93 and the terminal count signals, PCTRTC 88, ECTRTC 90 and ACTRTC 92. Each circuit providing an input to the next state logic does so by the next active PH2 84 following a transition in state by SBUS[0:4] 54. They are able to do so because all circuits within the the write state machine 32 are master/slave devices who outputs are valid on PH2 84.

The output of next state logic 110 is latched into latch 112 and provided to the rest of the write state machine circuitry as SBUS[0:4] 54.

Status bus outputs SBUS[0:4] 54 become active on the second PH2 84rising edge after RESET 52 is cleared. As a result of SBUS [0:4] 54 being PH2 84 active, each WSM 32 circuit evaluates SBUS [0:4] 54 while PH1 82 is high.

The method of programming and erasing implemented by next state controller 72 can be understood with reference to the state diagram of FIG. 5.

In FIG. 5, each bubble represents a state of write state machine 32. The name of each state is indicated on the top line of each bubble. The unique SBUS [0:4] 54 values for each state is indicated below the state name. The signals which are selected or enabled during each state are listed below the SBUS [0:4] 54 values. The combination of signals that cause the next state controller 72 to branch to another state are generally indicated in text beside each branch, with inactive signals preceded by an exclamation point "!" It will be understood that next state controller 72 branches from one state to another state regardless of the inputs to next state controller 72 when no combination of signals is indicated next to a branch.

When power is first applied to flash memory 20, the next state controller 72 is held in the POWER_UP state 120 by RESET 52. No events occur in this state, and the next state controller 72 simply begins execution after an active PROGRAM 38 or ERASE 40 is received from the command state machine 28.

Assume that after power-up, next state controller 72 receives an active PROGRAM 38 signal and an active ERASE 40 signal, as indicated by branch 122. These input signals cause the next state controller 72 to branch to the HARDWARE ERR state 124.

In the HARDWARE_ERR state 124, the status register's 34 two fail bits, PRG_ERR and ERASE_ERR are set to a logic high, indicating a hardware failure. From state 124, the write state machine 32 branches back to the POWER-UP state 120, regardless of the input signals to next state controller 72.

Assume that while in state 120, the next state controller 72 receives a request to program the boot block 23 while the boot block 23 is locked. The combination of signals representing this request is: PROGRAM 38 active, ERASE 40 inactive and LOCK 93 active. This combination of signals causes next state controller 72 to take branch 125 to the PROG_FAIL state 160. In this state 160, the status register's program fail bit is set and programming does not occur. From state 160 the next state controller branches back to the POWER_UP state 120.

The operation of the next state controller 72 when erasure of the boot block 23 has been requested while the boot block 23 is locked is similar. The combination of signals representing this request is: ERASE 40 active, PROGRAM 38 inactive and LOCK 93 active. This combination of signals causes the next state controller 72 to take branch 127 to the ERASE_FAIL state 168. In state 168 the erase fail bit is set and erasure of the boot block does not occur. From state 168 the next state controller 72 branches back to the POWER_UP state 120.

Assume that after entering state 120, the next state controller 72 receives an active PROGRAM signal 38, an inactive ERASE signal 40 and an inactive Lock Signal 93. This combination of signals initiates a program event, which will be performed on the byte indicated by address lines 24. The indicated byte will be programmed substantially to the value indicated on the data lines 26. In this situation, the next state controller 72 takes branch 126 to the PROG_SETUP state 132.

In the PROG_SETUP state 132, the next state machine 72 is configured for a program operation. In state 132 the period counter 76 is reset and the event counter's 74 program count is selected. The program path in memory array 22 is set-up. Afterwards, the next state controller 72 takes branch 134 to the PROGRAM state 136.

In state 136, the byte indicated by the signals AY [0:6] 55 and AX [0:9] 57 is programmed to a voltage level of approximately 6.75 volts, which represents a logic 0. During state 136, the period counter 76 is configured for a program operation by selecting its program period. The write state machine 32 remains in state 136 until the period counter 72 reaches its terminal count, indicating that the program voltage has been applied for a sufficient period of time to bring the byte voltages to 6.75 volts.

The next state controller 72 takes branch 138 to the program equalization state PROG_EQ 140 when PCTRTC 88 becomes active, a logic high.

Events during state 140 prepare the write state machine 32 and the array to perform program verification, i.e. to determine whether the previous program pulse successfully programmed the byte. In state 140 the period counter 76 is reset and the event counter 74 is enabled, allowing it to increment its count. The state of SBUS[0:4] 54 during state 140 also enables program verification of the memory array 22.

Now partially configured to perform program verification, next state controller 72 branches from state 140 to the PROG-VER-DELAY state 142. In state 142, the write state machine 32 verifies that the addressed byte has been successfully programmed by comparing SOUT[0:7] 54 to the program data stored in the DLC 80. The period counter 76 provides a verification delay to ensure that SOUT[0:7] 59 is valid before verification is performed.

The memory array 22 is prepared for program verification by enabling its word lines and turning the read path on. The DLC 80 is configured to perform program verification by bringing the signal CMPEN 287 active and bringing the signal PGVER 285 active. When active, the PGVER signal 285 allows the DLC 80 to indicate a match even when the microprocessor 999 has attempted to erase a programmed bit during a program operation. The effect of CMPEN 287 and PRGVER 285 will be discussed in more detail below with respect to the DLC 80 block diagram of FIG. 13.

During state 142, the program count of the event counter 74 remains selected, maintaining the event counter 74 in the program mode.

When PCTRTC 88 becomes active, the next state controller 72 examines MATCH 94 to determine whether the addressed byte has been successfully programmed. MATCH 94 will be a logic 1 if the byte has been successfully programmed and a logic 0 if it has not.

Given that the microprocessor 999 requested a program operation, the next state controller 72 can take only two of the three branches out of state 142.

Next state controller 72 takes branch 144 back to the PROGRAM-SETUP state 132 if the previous program pulse did not successfully program the addressed byte the event counter 74 has not reached its terminal count, which in program mode indicates that the maximum number of program pulses per program operation have been applied to the byte. The write state machine 32 cycles through states 132, 136, 140, and 142 until the byte is successfully programmed or the event counter 74 reaches its terminal count, whichever occurs first.

When the event counter 74 times out or the byte has been successfully programmed, next state controller 72 takes branch 146 to the first program done state PROG_DONE1 148. No events occur in state 148.

The next state controller 72 branches to the PROG_DONE2 state 150 from state 148. Again, no events occur.

During a program event next state controller 72 can only take three branches 152, 154, or 159 out of state 150.

Next state controller 72 takes branch 159 to state 124 when the next state controller 72 receives any illegal value of SBUS[0:4] 54. In the HARDWARE_ERR state 159 both the PRG_ERR and ERASE_ERR bits of the status register 34 are set. The next state logic 72 thereafter branches to state 120 from state 159 and the program operation ends in a hardware failure.

Table II of FIG. 6 includes SBUS[0:4] 54 values for states that are mapped as hardware errors. Table III of FIG. 7 gives the names for the signal acronyms used in Table II of FIG. 6.

If the program operation has failed the next state controller 72 takes branch 152 to the PROG_FAIL state 160 from state 150. In the PROG-FAIL state 160 the status register's 34 program fail bit PRG_ERR is set. Afterward, next state controller 72 branches back to the POWER_UP state 120. Again the program operation ends as a failure.

If, on the other hand, the program operation has been successful, then next state controller 72 takes branch 154 directly to state 120 from state 150. In this instance the program operation is successfully completed.

The erasing of memory array 22 is initiated by receipt of an active ERASE signal 38, an inactive PROGRAM signal 40 and an inactive LOCK signal while in the POWER_UP state 120. This combination of signals initiates an erase operation and causes next state controller 72 to take branch 162 to the ERASE state 164.

In ERASE state 164 next state controller 72 initializes the write state machine 32 for array preconditioning by resetting the address counter 78, period counter 76 and event counter 74.

From ERASE state 164 next state controller 72 branches to state 132 and begins preconditioning memory array 22; i.e. programming each bit, to a logic 0 prior to erasing the array.

During an erase operation next state controller 72 will cycle through states 132, 136 and 140 as described herein above with respect to program operations.

Differences between erase and program operations appear in the possible branches out of the PROG VER DELAY state 142. These differences occur, in part, because programming operations involve a single byte while erase operations involve the entire memory array 22. The additional possible states in an erase event cycle the address counter through each byte in the array.

Next state controller 72 branches to the PROG_INC_ADD state 166 from state 142 if the addressed byte has been successfully preconditioned. In the PROG_INC_ADD state 166 events prepare the write state machine 32 to precondition another byte of memory array 22. Address counter 78 is enabled, allowing its count to be incremented, thereby pointing to a new address within the memory array 22. The event counter 74 is reset and its program count selected. The program verify signal enables program verification of memory array 22 is enabled.

Next state controller 72 branches from state 166 back to the PROG_SETUP state 132, unless the address counter 78 has reached its terminal count.

The write state machine 32 cycles through states 132, 136, 140, 142 and 166 until every byte of the memory array 22 is preconditioned or a byte cannot be successfully preconditioned.

If a byte cannot be successfully preconditioned the next state controller 72 branches to PROG_DONE1 state 148 from PROG_VER_DELAY state 142. No events occur in state 148 and next state controller 72 branches to PROG_DONE2 state 150.

During an erase operation, next state controller 72 can take only three branches 156, 158 or 159 out of state 150.

The next state controller 72 takes branch 156 to the ERASE_FAIL state 168 when a byte has not been successfully preconditioned by the time the event counter 74 has reached its terminal count. In state 168 the ERASE_ERR bit is set. From state 168 next state controller 72 returns to the POWER_UP state 120. Thus, the erase operation ends unsuccessfully.

If, on the other hand, all bytes have been successfully preconditioned the next state controller 72 takes branch 158 to the ERASE_SETUP1 state 170 from state 150. The next state controller 72 then begins the process of erasing the array 22; i.e., bringing the cell voltages to approximately 3.25 volts.

In state 170 the address counter 78 and event counter 74 are reset. These actions prepare the write state machine 32 and the memory array 22 for erasure.

From state 170 next state controller 72 branches to ERASE_SETUP2 state 172. Events during state 172 further prepare the WSM 32 for erasing the array. In state 172 the value of SBUS[0:4] 54 causes the period counter 76 to be reset and enables erase verification of memory array 22.

The next state controller 72 branches to the APPLY ERASE state 176 from state 172. During state 176 the erase pulse is applied to the memory array 22 until the period counter 76 reaches its terminal count. Next state controller 72 advances from state 176 to the ERASE_OFF state 178 when PCTRTC 88 becomes active.

In anticipation of erase verification the period counter 76 is reset in state 178. The event counter 74 is enabled, allowing it to increment its count and the memory array 22 read lines continue to be enabled, allowing access to read the contents of memory array 22. Erase verification of memory array 22 remains enabled.

Next state controller 72 branches to state 180 from state 178.

During the ERASE_VERIFY state 180 the write state machine 32 determines whether the indicated byte of memory has been successfully erased. The events in state 180 configure the WSM 32 to perform erase verification. During state 180 the period counter 76 is reset and its erase verification delay selected. The erase verification delay is approximately the time between when the erase voltage is removed and SOUT[0:7] signals 59 are valid.

In state 180, the DLC 80 circuitry is configured to verify that the addressed byte has been successfully erased by setting the signal COMPDAT 283 to a logic one and bringing the signal CMPEN 287 active. The signals COMPDAT 283 and CMPEN 287 and the DLC 80 circuitry will be discussed in more detail herein below.

During state 180, the read path of memory array 22 is turned on and the memory array 22 is enabled, allowing memory array 22 to output SOUT[0:7] 59 to the DLC 80.

After the period counter 76 times out, the next state controller 72 determines whether the erase operation has been successful by examining the MATCH signal 94. MATCH 94 is a logic one when the byte has been successfully erased and is a logic zero when the byte has not been successfully erased.

Next state controller 72 branches to state 172 from state 180 to apply another erase pulse if MATCH 94 indicates that the byte currently addressed has not been successfully erased and the event and address counters 74 and 78 have not reached their terminal counts. The write state machine 32 cycles through states 172, 176 and 180 until the event counter 74 times out or the erasure of the addressed byte is successfully verified.

Next state controller 72 takes branch 182 to the ERASE_FAIL state 168 if a memory byte is not successfully erased after the event counter 74 reaches its terminal count. In state 168 the ERASE_ERR bit is set. Thereafter, the write state machine 32 branches back to state 120. Thus, the erase operation ends unsuccessfully.

The next state controller 72 branches to the ERASE_INC_ADD state 184 from state 180 when a byte is successfully verified and not every byte in the memory array 22 has been verified, as indicated by an inactive ACTRTC signal 92. In state 184 the address counter 78 is enabled, allowing it to increment its count and allowing signals AY[0:6] 55 and AX[0:9] 57 to point to another byte in array 22. In state 184, the memory array 22 and the DLC 80 are readied to verify the erasure of another byte within the memory array 22 by bringing CMPEN 287 active and enabling erase verification of the memory array 22.

After pointing to a new byte within the array 22, the write state machine 32 compares the current byte value to the desired value to determine whether application of an additional erase pulse to the memory array necessary. These events occur in states 180, 184 and 186.

The next state controller 72 branches to the ERASE_INC_DELAY state 186 from state 184. State 186 provides a small delay before an erase performing erase verification. In state 186 the DLC 80 is maintained in its erase-verify configuration by keeping COMPDAT 283 set to logic 1 and COMPEN 287 active. Erase verification of memory array 22 continues to be enabled.

From state 186 the next state controller 72 branches back to the ERASE_VERIFY state 180. The DLC 80 compares the contents of the current memory location to voltage levels representative of an erased byte. If verification indicates that the byte is already erased, next state controller 72 will cycle through states 184, 186 and 180 until an unerased byte is located in the memory array 22 or until the address counter 78 reaches its terminal count.

The next state controller 72 branches back to state 172 from ERASE_VERIFY state 180 when an unerased memory location is reached and the address counter 78 has not yet reached its terminal count. Next state controller 72 will cycle through states 172, 176, 178, 180, 184, and 186 as described above until the end of the selected block within memory array 22 is reached or a byte within memory array 22 cannot be successfully erased.

When every byte in the selected block of memory array 22 has been successfully erased, as indicated by ACTRTC 92 active, next state controller 72 takes branch 188 to the POWER_UP state 120. The erasure of the array 22 is thus successfully completed.

FIG. 8 illustrates in block diagram form the oscillator and phase generator 70. Oscillator 200 begins operating upon receipt of an inactive RESET signal 52. The oscillator 200 runs as long as RESET 52 is inactive. When RESET 52 is asserted the oscillator 200 ceases to run.

The output 202 of oscillator 200 is provided to the phase generator 204. The phase generator 204 includes a two-bit shift register that is held inactive until activated. The shift register shifts through 4 combinations—namely, "00," "01," "11," and "10." Two decoders of phase generator 204 watch for the "01" and "10" states and generate two out clocks—namely, PH1 82 and PH2 84, respectively, which are routed to nearly all of the WSM 32.

In the preferred embodiment, PH1/PH2 82 and 84 have a typical cycle time of 500 ns. The duty cycle of both PH1 82 and PH2 84 is approximately 25%.

The start-up timing for PH1 82 and PH2 84 in relation to RESET 52 and SBUS[0:4] 54 can be seen in FIG. 9. RESET 52 goes low on the rising edge of either PROGRAM 38 or ERASE 40. After RESET 52 falls PH2 84 is the first clock to go active high.

SBUS[0:4] 54 changes state on the rising edge of the second PH2 84 pulse; all circuits within WSM 32 evaluates SBUS[0:4] 54 during PH1 82 active to guarantee valid readings.

FIG. 10 illustrates in block diagram form the period counter 76. The period counter 76 includes a period counter SBUS decoder 210, a 15 bit shift register counter 212, a terminal count match circuit 214, and a latch 216.

The period counter SBUS decoder 210 controls the counter 212 and the terminal count match circuit 214. Decoder 210 decodes SBUS signals 54 and determines whether the counters 21 2 count should be reset and selects among the three possible terminal counts.

The operation of SBUS decoder 210 during each state illustrated in FIG. 5 can be determined with reference to FIG. 6. For example, FIG. 6 indicates that in the APPLY ERASE state 176, that the SBUS decoder 210 selects the erase terminal count by setting PCTSELERS to a logic 1.

SBUS decoder 210 is implemented as random logic in the preferred embodiment.

The shift register counter 212 does not incorporate a counter enable and thus continues to run in all states except for those in which it is reset by an active PCTRST signal 218.

The Q outputs 220 of the shift register 212 are fed to the terminal count match circuit 214. Terminal count match circuit 214 analyzes Q outputs 220 and indicates when a selected terminal count is reached. The terminal count match circuit recognizes three possible terminal counts: erase, program, and verify, which are selected by active signals PCTSELERS, PCTSELPGM, and PCTSELVER, respectively.

Approximate time periods are 10 μsec for each programming pulse 10 msec for each erase pulse, and 3 μsec for each program verify operation and each erase verify operation.

Output TCO UNT 222 is active for only one state because the counter 212 continues to increment TCOUNT 222. To store the active terminal count TC©UNT 222 latch 216 is used in conjunction with OR gate 217.

Latch 216 is reset by RESET 52 when the write state machine 32 is first powered up, setting its Q output 224 to a logic 0. Latch 216 is also reset when the PCTRST 21 8 signal is asserted. When TCOUNT 222 goes active high, Q output 224 goes to a logic 1. Q output 224 keeps the latch's input at logic 1 after TCOUNT 222 goes inactive, thus keeping PCTRTC 88 at a logic 1 until latch 216 is reset by RESET 52.

FIG. 11 illustrates in block diagram form the event counter 74. The event counter 74 includes an event counter SBUS decoder 230, a thirteen bit counter 232, an event counter terminal count select circuit 234, a latch 236, and an OR gate 238.

The event counter SBUS decoder 230 controls the counter 232 and the terminal count match circuit 234. Decoder 230 decodes SBUS[0:4] 54 and determines whether the counter 232 should be enabled or reset, and selects between the the two possible event counter terminal counts.

The operation SBUS decoder 230 for each state of FIG. 5 can be determined with reference to FIG. 6. For example, FIG. 6 indicates that in the ERASE_VERIFY state 180 SBUS decoder 230 selects the erase terminal count by setting ECTRER.

The event counter SBUS decoder 230 is implemented as random logic in the preferred embodiment.

The counter 232 is reset by the SBUS decoder 230 whenever the WSM 32 begins to program, precondition or erase a new byte. The ripple carry counter 232 increments its count only when enabled by an active ECTREN signal 240. The Q outputs 242 of counter 232 are fed to the event counter terminal count match circuit 234.

Event counter terminal count match circuit 234 analyzes Q outputs 242 and indicates when a selected terminal count is reached. The event counter terminal count match circuit 234 recognizes two possible terminal counts: namely, erase and program, which are selected by the signals ECTRER and ECTRPG.

Event counter 74 allows over 8000 erase pulses to be applied when an erase operation is selected and 50 program pulses to be applied when a program operation is selected. Event counter 74 indicates when the maximum number of erase pulses or program pulses has been applied by bringing event counter signal ECTRTC 90 active.

TCOUNT 244 is latched in exactly the same fashion as TCOUNT 222 using latch 236 and OR gate 238.

FIG. 12 illustrates in block diagram form the address counter 78. The address counter 78 includes TTL input buffers 250,252 address counter SBUS decoders 254, 256, a 17 bit linear counter 258, a bypass multiplexer 260, and boot block detector 79.

The buffers 250 and 252 convert the TTL address inputs A[0:16] 24 to CMOS levels. The buffer outputs AIN[0:16] 262 are applied to the bypass multiplexer 260 and the parallel load inputs of counter 258.

When the READY signal 50 is a logic high, the address counter 78 provides flow through addressing by selecting the buffered TTL outputs 262 as the outputs of bypass multiplexer 260.

The address counter SBUS decoders 254 and 256 control the operation of the counter 258. SBUS decoder 254 provides counter 258 with a reset signal ACTRRST 266. SBUS decoder 256 decodes SBUS[0:4] 54 to generate a counter enable signal ACTEN 268.

The operation of SBUS decoders 254 and 256 can be understood with reference to FIG. 6. For example, FIG. 6 indicates that SBUS decoder 256 enables counter 258 in the PROG_INC_ADD state 166 by bringing the signal ACTEN 268 to a logic 1.

The address counter's SBUS decoders 254 and 256 are implemented as random logic in the preferred embodiment.

The counter 258 is a 17 bit linear counter with parallel load and will not be described in detail herein.

During a program operation the address counter 78 operates as follows. Before the command state machine 28 issues a program command 5 to the write state machine 32, the READY signal is a logic high indicating that write state machine 32 is ready to perform an operation. This selects the TTL buffer outputs 262 as the output of bypass multiplexer 260.

Prior to bringing signal PROGRAM 38 to an active condition, the command state machine 28 brings the address latch enable signal ALE 49 active. ALE 49 active loads the buffered address outputs AIN[0:16] 262 into the counter 258. Signals AQ[0:16] 264 and AIN[0:16] 262 will be the same value until the counter 258 is enabled and increments its count.

The bypass multiplexer 260 selects counter inputs AQ [0:16] 264 as outputs when PROGRAM 38 becomes active. The multiplexer 260 selects AQ[0:16] 264 by forcing READY 50 inactive. The counter 258 is not allowed to increment its count during a program operation, thus counter 258 acts as an address latch during program operations.

The operation of the address counter 28 during erase operations is initially similar to that during program operations. However, the counter 258 is enabled during erase operations in the PROG_INC_ADD state 166 and ERASE_INC_ADD state 184, allowing signals AY[0:16] 55 and AX[0:9] 57 to cycle through the addresses within memory array 22 until the end address space of memory the array 22 is reached, as indicated by active state of ACTRTC 92.

The boot block detector 79 analyzes the four most significant bits of the address signal, AQ[13:16], to determine whether an address within the boot block 23 has been chosen for programming or erasure. If an address within the boot block 23 has been selected and the PROTECT signal 41 is an active logic high, indicating that the boot block 23 is to be protected from programming or erasure, then boot block detector 79 will output an active logic low LOCK signal 93. LOCK signal 93 is provided to next state controller 72 to prevent the programming or erasure of the boot block 32 while the boot block 23 is locked. If, on the other hand, an address within the boot block 23 has not been selected for programming or erasure of the boot block 23 is unlocked, as indicated by the PROTECT signal 41 inactive low, then LOCK signal 93 will be inactive i.e., a logic high. While LOCK signals 93 is inactive programming or erasure of the selected block may occur.

FIG. 13 shows of the boot block detector 79. Boot block detector 79 consists of a five input NAND gate 400. Thus, LOCK signal 93 will be active only when all five inputs are a logic high.

This design of the boot block detector 79 flows from the addressing table chosen from memory array 22. A portion of the addressing table for memory array 22 is shown in FIG. 14.

The boot block 23 occupies the addresses 1FFFF (hexidecimal) to 1E000 (hexidecimal). As can be seen in FIG. 14 the four MSBs, AQ[13:16], are all high within this address range. For any address outside the boot block address range, at least one of the four MSBs will be a logic low, which will force the lock signal to an active logic active high, thereby allowing programming or erasure of the byte addressed.

The preferred embodiment of the present invention supports placement of the boot block 23 at one end of the addressing range; e.g., 0000 (hexidecimal), or the other end of the addressing range e.g., 1FFFF (hexidecimal). This is achieved by flipping the four MSBs of AQ[0:16] 264, AQ[13:16], via a switch address space bit.

PROTECT signal 41 is generated by command state machine 28 in response to the CE2 43. When CE2 43 is brought up to 12 volts, command state machine 28 forces PROTECT signal 41 to a logic low, thereby unlocking the boot block 23 and allowing the programming or erasure of addresses within the boot block 23. As long as CE2 43 is below 12 volts, PROTECT signal 41 will be a logic high indicating that the boot block 23 is to be protected from any alteration of data.

FIG. 15 illustrates in block diagram form the data latch and comparator circuit ("DLC") 80. The DLC 80 includes eight latch and comparator circuits **270*a*–270*h*, one for each data bit; DLC SBUS decoders 282,284, and 286; an AND gate 288; a multiplexer 290; and a latch 292**.

Microprocessor 999 writes commands to flash memory 20 via data lines DATA[0:7] 26, while holding CEB 44a and WEB 46 active. The active states CEB **44*a* and WEB 46 enable the TTL input buffers 272*a*–272*h* within each DLC latch and comparator circuit 270*a*–270*h* to convert the data on lines 26 to the CMOS level signals of DATAIN[0:7] 27**.

The CSM 28 brings data latch enable signal DLE 47 active if DATAIN[0:7] 27 represents a program or an erase command. When DLE 47 becomes active, the data from TTL buffers **272*a*–272*h* is clocked into latches 274*a*–274*h*. During program verification the latch and comparator circuits 270*a*–270*h* operate as follows. The ERASE signal 40 is inactive, selecting the 10 inputs 273 of multiplexers 276*a*–276*h* as the multiplexers' outputs. Thus, the data stored in latches 272*a*–272*h* is applied to the LAT inputs 277 of comparators 278*a*–278*h***.

The comparator outputs **279*a*–279*h* indicate whether each bit of the program data matches the sense amp outputs SOUT[0:7] 59. For each comparator 278*a*–278*h*, if the two comparator inputs SOUT 275 and LAT 277 agree, the comparator output 279 will be a logic one. If the comparator inputs 275 and 277 do not agree, the output 279** will be a logic 0.

During program verification, the operation of the comparators **278*a*–278*h* described above is modified by the active program verify signal PGVER 285. As can be seen from Table 1, when PGVER 283 is active, comparators 278*a*–278*h* output a logic 1 when the memory cell stores a logic 0 and the memory cell should store a logic 1. The comparators 278*a*–278*h* indicate a match in this situation because the write state machine 32** cannot erase a programmed bit during a program operation.

TABLE 1

| | | MATCH OUTPUT | |
|---|---|---|---|
| SOUT | LAT | PGVER INACTIVE | PGVER ACTIVE |
| 0 | 0 | 1 | 1 |

TABLE 1-continued

| | | MATCH OUTPUT | |
|---|---|---|---|
| SOUT | LAT | PGVER INACTIVE | PGVER ACTIVE |
| 0 | 1 | 0 | 1 |
| 1 | 0 | 0 | 0 |
| 1 | 1 | 1 | 1 |

The MATCH outputs 279*a*–279*h* of all the comparators 278*a*–278*h* are ANDed together by AND gate 288. The output of AND gate 288 is a logic 1 when each bit of SOUT[0:7] 59 and DATAIN[0:7] 27 match and a logic 0 when SOUT[0:7] 59 and DATAIN [0:7] 27 do not match.

The output 289 of AND gate 288 is applied to the I1 input of the output multiplexer 290. The I1 input of multiplexer 290 is selected as the output of multiplexer 290 by an active CMPEN signal 287.

CMPEN 287 is active during program verification, thus allowing the AND gate output 289 to flow through latch 292 and control the logic state of MATCH signal 94.

The value of MATCH 94 is stored by latch 292 when the next state controller 72 moves out of the program verification state. The Q output of latch 292 is fed back to the 10 input of multiplexer 290. When CMPEN 287 becomes inactive, the 10 input of multiplexer 290 is selected allowing it to control the latch 292.

MATCH 94 is reset by RESET 52.

The operation of the data latch and comparator circuits 270*a*–270*h* during erase verification is similar to that described above for program verification, with the following exceptions. First, I1 inputs of multiplexers 276*a*–276*h* are set to a logic 1 by the active COMPDAT1 283 signal during erase verification. This establishes a voltage reference with which to compare the sense amp outputs. Second, active ERASE 40 selects the I1 inputs of multiplexers 276*a*–276*h* to be output to the comparators 278*a*–278*h*. Third, PGVER 285 is inactive, which permits comparators 278*a*–288*h* to operate without modification.

The DLC SBUS decoders 282, 284 and 286 help control the operation of data latch and comparator circuits 272*a*–272*h*. The operation of DLC SBUS decoders 282,284 and 286 can be determined with reference to FIG. 6. For example, FIG. 6 indicates that in the ERASE_INC_ADD, ERASE_INC_DELAY and ERASE_VERIFY states 184, 186, 180 DLC SBUS decoder 286 sets CMPEN 289 high.

in a preferred embodiment, DLC SBUS decoders 282, 284, and 286 are implemented in random logic.

FIG. 16 illustrates in block diagram form the status register 34. The status register 34 includes a clock generator 300, five output latches 302*a*–302*e*, one for each bit of signal STATUS[3:7] 56, status register SBUS decoders 304 and 306; latches 308 and 312, OR gates 310 and 314, and inverter 316.

The status register's outputs 56 are synchronized to output enable bar signal OEB 46*a*. The clock generator 300 accomplishes this synchronization by generating a set of clock pulses PH'1/PH'2 320 whenever OEB 46*a* toggles states. Clock pulses PH'1/PH'2 320 control the clocking in of data into output latches 302*a*–302*e*. Thus, it will be understood that OEB 42 must be toggled in order to read valid data from the output latches 302*a*–302*e*.

The signals READY 50, IDLE 53, and LOWVPP 51 are input directly to the D inputs of output latches 302*a*–302*c* respectively.

Status register SBUS decoder 304 decodes SBUS[0:4] 54 to detect program failures. When SBUS decoder 304 detects a failure, PRG_FAIL signal 322 is set to a logic 1. Because SBUS[0:4] 54 indicates a program failure during only one state period, the active PRG FAIL signal 322 is stored using latch 308 and OR gate 310, until the microprocessor 999 chooses to reset the status register 34. The status register 34 is reset by bringing STATRS 45 active. This pair of devices, latch 308 and OR gate 310, operates in the same as a substantially similar pair of devices in the period counter 76.

Status register SBUS decoder 306 decodes SBUS[0:4] 54 to detect erase failures. When SBUS decoder 306 detects a failure ERSFAIL signal 324 is set high. Because SBUS[0:4] 54 indicates an erase failure during only one state, the active ERSFAIL signal 324 is stored using latch 312 and OR gate 314 until the microprocessor 999 chooses to reset the status register. This pair of devices, OR gate 314 and latch 312, operates in the same manner as a substantially similar pair of devices in the period counter 76, which was previously discussed.

Table II of FIG. 6 describes the operation of status register SBUS decoders 304 and 306. For example, FIG. 6 indicates that for all hardware failure states, PRG_FAIL 322 is set.

In a preferred embodiment, both status register SBUS decoders 304 and 306 are implemented using random logic.

The active outputs of latches 308 and 312 are reset when status register reset signal STATRS 45 is active high, which occurs as the result of receipt of the CLEAR STATUS REGISTER command from the microprocessor 999.

STATUS[3:7] 56 include RDY/BSY signal, also known as STAT7. When RDY/BSY is a logic zero when the write state machine 32 is busy. A logic one on STAT 7 indicates that the write state machine 32 has completed its operation and is prepared to perform another operation and that the other status outputs are valid.

The STAT 6 signal is also known as the ERASE_SUSPEND signal. ERASE_SUSPEND becomes active, a logic 1, when the WSM 32 has entered an idle state during an erase operation, and indicates that the memory array 22 is readable. ERASE_SUSPEND is set and cleared by the synchronizer 30, based upon a request from the microprocessor 999 and the status of the WSM 32.

The STAT 5 signal is also known as the erase error ERASE_FAIL signal. The ERASE_FAIL signal is set to a logic 1 if signal WSM 32 cannot successfully preprogram or erase the memory array 22. ERASE_FAIL is also set to a logic, if the erase command is botched or a hardware error is encountered. The ERASE_FAIL signal is set by the WSM 32 and cleared by the STATUS REGISTER CLEAR command.

The STAT 4 signal is also known as the program fail signal PRG_FAIL. PRG_FAIL is set to a logic one if the WSM 32 cannot successfully program a byte. PRG_FAIL is also set to a logic 1 if an erase command is botched or a hardware error is encountered. PRG_FAIL is set by the SBUS[0.4] 54 and cleared by the STATUS REGISTER CLEAR command.

The STAT 3 signal is also known as LOS_VPP LOW_VPP is set if the programming voltage Vpp 36 drops anytime during a program or erase operation. However, if PRG_FAIL or ERASE_FAIL is also set then the low voltage level of Vpp 36 had no effect on the operation. LOW_VPP is cleared by STATRS.

The status register 34 also outputs to the synchronizer 30 the status register reset bar signal STATRB 61, which is an inversion of STATRS 45.

In summary, circuitry for protecting the integrity of data stored within a block block 23 has been described. The boot block 23 will remain locked and protected from programming and erasure so long as the voltage on CE2 43 is below 12 volts. Data within the boot block 23 may be altered by bringing the voltage on the CE2 pin 43 up to 12 volts. This feature grants users of non-volatile semiconductor memory with automated programming and erasure features added security from the accidental loss of boot block data.

In the foregoing specification, the invention has been described with specific exemplary embodiments thereof. It will, however, be evident that various modifications and changes may be made thereto without departing from the broader spirit and scope of the invention as set forth in the appended claims. The specifications and drawings are, accordingly to be regarded in an illustrative rather than a restrictive sense.

What is claimed is:

1. A memory system comprising:

a memory array comprising a plurality of addressable locations; and a write state machine coupled to the memory array, said write state machine controlling operations to be performed on the memory array, receiving control signals indicative of an operation or sequence of operations to be performed at at least one block of at least one address in the array, receiving predetermined bits of an identification of a block of addresses and further receiving a protect signal, generating an active lock signal if the predetermined bits of the identification of the block of addresses and the protect signal are in predetermined states, responding to said lock signal by failing to perform the operation identified, and responding to an absence of said lock signal by performing each operation identified on every address within the block;

a command state machine, coupled to receive data including commands, and generating control signals to control said write state machine, said command state machine further .generating the protect signal.

2. The memory system as set forth in claim 1, wherein said write state machine comprises:

an address counter which receives and buffers control signals from the command state machine to be applied to the addresses within a given block of memory, and iteratively issues signals to address locations in the memory array corresponding to said block of addresses, said address counter further comprising a protected address detector which detects protected memory addresses and senses a state of the protect signal, said address counter outputting an active lock signal if the predetermined bits of an address are in predetermined states indicating that the address is to be protected and the protect signal is in a predetermined state indicating that the address is to be protected; and a state controller coupled to receive the identification of the operation to be performed and the lock signal, said state controller determines a state of the write state machine, said state controller indicating the state of the write state machine to be a state in which the operation is not performed if the operation is an identified operation and the lock signal is active.

3. The memory system as set forth in claim 2, wherein the protected address detector comprises a multiple input AND gate coupled to receive the predetermined bits of the address and the protect signal and outputs the lock signal.

4. The memory system as set forth in claim 1, wherein the memory controller further comprises a command state machine coupled to receive the command from the microprocessor, said command state machine further coupled to receive the protect signal, said command state machine issuing control signals to the write state machine to perform the operation, said command state machine further issuing the protect signal to the write state machine.

5. A system comprising:

a memory array comprising memory locations identified by addresses;

a microprocessor for issuing commands of memory operations to be performed at at least one address in the memory array, said commands comprising an identification of at least one operation to be performed and an identification of at least one block of memory addresses, said microprocessor further issuing a protect signal, which when active, indicates to protect predetermined locations in the memory array;

a memory controller coupled between the memory array and the microprocessor, said memory controller receiving the commands, data, and identifications of blocks of addresses and issuing operation control signals to perform the identified operation at the at least one address in the memory array, said memory controller comprising a command state machine coupled to receive the identification of at least one operation to be performed and the protect signal and issuing write state machine control signals which comprise signals to identify the operation to be performed and the state of the protect signal, said memory controller further comprising a write state machine coupled to the memory array to control operations to be performed on the memory array, said write state machine comprising logic coupled to receive predetermined bits of the address and write state machine control signals, said logic generating an active lock signal if the predetermined bits of the address and the protect signal are in predetermined states, said write state machine responding to the active lock signal by failing to perform the operation identified.

6. The system as set forth in claim 5, wherein said write state machine comprises:

an address counter which receives and buffers the write state machine control signals to be applied to the addresses within a given block of memory, and iteratively issues control signals to address locations in the memory array corresponding to said block of addresses, said address counter further comprising a protected address detector which detects protected memory addresses and senses a state of the protect signal, said address counter outputting an active lock signal if the predetermined bits of the address are in predetermined states indicating that the address is to be protected and the protect signal is active; and a state controller coupled to receive the identification of the operation to be performed and the lock signal, said state controller determining a state of the write state machine, said state controller indicating the state of the write state machine to be a state in which the operation is not performed if the operation is an identified operation and the lock signal is active.

7. The memory system as set forth in claim 6, wherein the protected address detector comprises a multiple input AND gate coupled to receive the predetermined bits of the address and the protect signal and outputs the lock signal.

8. In a system comprising a memory array comprising memory locations identified by addresses, a microprocessor for issuing commands of memory operations to be performed at at least one address in the memory array, said commands comprising an identification of an operation to be performed and a memory address and a memory controller coupled between the memory array and the microprocessor, said memory controller receiving the commands and issuing control signals to perform the identified operation at the at least one address in the memory array, a method for protecting predetermined memory locations comprising the steps of:

said microprocessor issuing a protect signal to said memory controller, which when active, indicates to protect predetermined locations in the memory array;

said memory controller receiving predetermined bits of the address and the protect signal, and generating a lock signal if the predetermined bits of the address and the protect signal are in predetermined states;

said memory controller entering a state determined by the status of the protect signal and by an immediately preceding state of the memory controller, and operating on subsequent memory addresses as determined by said state; such that if said lock signal is generated, said memory controller failing to perform the operation identified, and if said lock signal is not generated, said memory controller performing the operation identified according to the state of the memory controller, on addresses at which the memory operations identified are to be performed.

* * * * *